(12) United States Patent
Henson et al.

(10) Patent No.: US 7,452,784 B2
(45) Date of Patent: Nov. 18, 2008

(54) FORMATION OF IMPROVED SOI SUBSTRATES USING BULK SEMICONDUCTOR WAFERS

(75) Inventors: William K. Henson, Peekskill, NY (US); Dureseti Chidambarrao, Weston, CT (US); Kern Rim, Yorktown Heights, NY (US); Hsingjen Wann, Kent Lakes, NY (US); Hung Y. Ng, New Milford, NJ (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 11/420,279

(22) Filed: May 25, 2006

(65) Prior Publication Data
US 2007/0275537 A1    Nov. 29, 2007

(51) Int. Cl.
    *H01L 21/76*    (2006.01)
(52) U.S. Cl. ................ 438/421; 438/455; 257/E21.545
(58) Field of Classification Search ................ 438/421, 438/455, 510; 257/E21.545
    See application file for complete search history.

(56) References Cited

U.S. PATENT DOCUMENTS

| | | | |
|---|---|---|---|
| 5,057,450 A | 10/1991 | Bronner et al. | |
| 5,364,800 A | 11/1994 | Joyner | |
| 5,490,034 A | 2/1996 | Zavracky et al. | |
| 6,277,703 B1 | 8/2001 | Barlocchi et al. | |
| 6,537,894 B2 | 3/2003 | Skotnicki et al. | |
| 6,759,714 B2 | 7/2004 | Kim et al. | |
| 6,887,773 B2 | 5/2005 | Gunn, III et al. | |
| 6,936,522 B2 | 8/2005 | Steegen et al. | |
| 7,015,147 B2 | 3/2006 | Lee et al. | |
| 2004/0124439 A1 | 7/2004 | Miniami et al. | |
| 2004/0262695 A1* | 12/2004 | Steegan et al. | 257/371 |
| 2005/0116290 A1* | 6/2005 | de Souza et al. | 257/347 |

\* cited by examiner

*Primary Examiner*—Bradley K Smith
(74) *Attorney, Agent, or Firm*—Scully, Scott, Murphy & Presser, P.C.; H. Daniel Schnurmann

(57) ABSTRACT

The present invention relates to a semiconductor-on-insulator (SOI) substrate having one or more device regions. Each device region comprises at least a base semiconductor substrate layer and a semiconductor device layer with a buried insulator layer located therebetween, while the semiconductor device layer is supported by one or more vertical insulating pillars. The vertical insulating pillars each preferably has a ledge extending between the base semiconductor substrate layer and the semiconductor device layer. The SOI substrates of the present invention can be readily formed from a precursor substrate structure with a "floating" semiconductor device layer that is spaced apart from the base semiconductor substrate layer by an air gap and is supported by one or more vertical insulating pillars. The air gap is preferably formed by selective removal of a sacrificial layer located between the base semiconductor substrate layer and the semiconductor device layer.

1 Claim, 20 Drawing Sheets

FORMATION OF IMPROVED SOI SUBSTRATES USING BULK SEMICONDUCTOR WAFERS

FIELD OF THE INVENTION

The present invention relates to improved semiconductor-on-insulator (SOI) substrates. More specifically, the present invention relates to SOI substrates that each has one or more device regions including a semiconductor device layer that is isolated from a base substrate layer by a buried insulator layer and supported by one or more vertical insulating pillars, as well as to methods and precursor structures that can be used to form such SOI substrates.

BACKGROUND OF THE INVENTION

Semiconductor-on-insulator (SOI) technology is becoming increasingly important in semiconductor processing. A SOI substrate structure typically contains a buried insulator layer, which functions to electrically isolate a top semiconductor device layer from a base semiconductor substrate. Active devices, such as transistors, are typically formed in the top semiconductor device layer of the SOI substrate.

Devices formed using SOI technology (i.e., SOI devices) offer many advantages over their bulk counterparts, including, but not limited to: reduction of junction leakage, reduction of junction capacitance, reduction of short channel effects, better device performance, higher packing density, and lower voltage requirements.

It is therefore desirable to form SOI substrates from bulk semiconductor substrates. One conventional method for forming a SOI substrate from a bulk silicon substrate involves selective masking of certain regions on the surface of a bulk silicon substrate, followed by anodization to form porous silicon at unmasked regions on the silicon substrate surface. Silicon at the masked regions is not porified and therefore forms solid silicon pillars. A silicon layer is subsequently grown over both the porous and non-porous portions of the silicon substrate. By forming an opening in the subsequently grown silicon layer, the porous portions of the silicon substrate become exposed and can therefore be selectively removed to form hollow regions underneath the subsequently grown silicon layer, while the non-porous silicon pillars provide the necessary structural support for the silicon layer during this process. Finally, the hollow regions can be filled with an insulator material to form a buried insulator film underneath the silicon layer, thereby resulting in a SOI substrate.

FIG. 1A shows a top view of a SOI substrate formed by the above-described conventional method, while FIGS. 1B and 1C respectively show cross-sectional views of such a SOI substrate along line I and line II. Specifically, the conventional SOI substrate comprises a device region 2 located over a base substrate 12 and encircled by trench isolation regions 20. A semiconductor device layer 16 is located at the device region 2, with a gate dielectric layer 3 and gate electrodes 5 are located thereabove. The semiconductor device layer 16 is separated from the base substrate 12 by a buried insulator layer 14, thereby forming a SOI configuration. Silicon pillars 11 are located at edges of the device region 2, as shown in FIGS. 1A and 1C. The silicon pillars 11 provide structural support for the semiconductor device layer 16 before the buried insulator layer 14 is formed.

However, the silicon pillars 11 in the above-described conventional SOI substrate structure extend from the base substrate 12 through the buried insulator layer 14 to overlap with portions of the semiconductor device layer 16, as shown in FIG. 1C. The overlap portions between the silicon pillars 11 and the semiconductor device layer 16 behave more like bulk structures than SOI structures, which undermines the advantages offered by true SOI structures.

Further, the processing steps used for forming such a conventional SOI substrate structure inevitably involve alignment errors and process bias, which do not scale well. Therefore, when the device structure is scaled from 90 nm down to 45 nm, the device performance will be further compromised.

There is therefore a need for improved SOI substrates that can be formed using bulk semiconductor structures, without undermining the advantages of true SOI structures or compromising the device performance at device dimensions below 45 nm.

There is also a need for a simple and effective method of fabricating the improved SOI substrates.

SUMMARY OF THE INVENTION

In one aspect, the present invention relates to a semiconductor-on-insulator (SOI) substrate comprising one or more device regions, each of which comprises at least a base semiconductor substrate layer and a semiconductor device layer with a buried insulator layer located therebetween, wherein the semiconductor device layer of each device region is supported by one or more vertical insulating pillars.

In another aspect, the present invention relates to a precursor substrate structure comprising at least one device region having at least a base semiconductor substrate layer and a semiconductor device layer with an air gap located therebetween, wherein the semiconductor device layer is supported by one or more vertical insulating pillars.

In a further aspect, the present invention relates to a method for forming a semiconductor-on-insulator (SOI) substrate, comprising:

forming a substrate structure comprising at least a base semiconductor substrate layer and a semiconductor device layer with a sacrificial layer located therebetween;

patterning the substrate structure to form one or more device regions defined by one or more isolation trenches, wherein each device region comprises a base semiconductor substrate layer and a semiconductor device layer with a sacrificial layer located therebetween;

forming one or more insulator strips each having at least a vertical portion over a sidewall of one of the isolation trenches and a horizontal portion over an upper surface of one of the device regions;

selectively removing the sacrificial layer from each device region to form an air gap between the base semiconductor substrate layer and the semiconductor device layer, wherein the vertical portions of the one or more insulator strips form vertical insulator pillars to support the semiconductor device layer; and filling the air gap within each device region with an insulator material to form a buried insulator layer between the base semiconductor substrate layer and the semiconductor device layer.

The above-described method may further comprise filling the isolation trenches with an insulating trench fill material and planarizing the substrate structure to remove the horizontal portions of the insulator strips and to form a substantially planar upper surface.

Preferably, but not necessary, lateral etching is carried out after patterning of the substrate structure and before formation of the insulator strips to selectively remove a peripheral portion of the sacrificial layer in each device region. In this manner, the vertical portions of the subsequently formed patterned insulator strips comprise ledges that extend between the base semiconductor substrate layer and the semiconductor device layer at each device region.

In still another aspect, the present invention relates to a SOI substrate comprising at least two device regions, each of which comprises at least a base semiconductor substrate layer and a semiconductor device layer with a buried insulator layer located therebetween, and wherein the semiconductor device layers of such device regions have different thicknesses.

In a still further aspect, the present invention relates to a SOI substrate comprising at least two device regions, each of which comprises at least a base semiconductor substrate layer and a semiconductor device layer with a buried insulator layer located therebetween, and wherein the semiconductor device layers of such device regions have different crystallographic orientations.

Other aspects, features and advantages of the invention will be more fully apparent from the ensuing disclosure and appended claims.

DETAILED DESCRIPTIONS OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The term "vertical" as used herein refers to a direction that is perpendicular to the substrate surface or a direction that deviates from such a perpendicular direction at an angle of less than 60°.

The term "substantially planar" as used herein refers to the smoothness of a surface defined by surface protrusions or depressions of less than about 10 nm in height or depth.

The present invention provides improved SOI substrates that comprise vertical insulating pillars for supporting the semiconductor device layers. Specifically, each of the SOI substrates of the present invention has a substantially planar upper surface and comprises one or more device regions, each of which comprises at least a base semiconductor substrate layer and a semiconductor device layer with a buried insulator layer located therebetween. The semiconductor device layer of each device region is supported by one or more vertical insulating pillars, which are preferably located at edges of each device region but can also locate at any other areas within each device region.

Figure 1A:
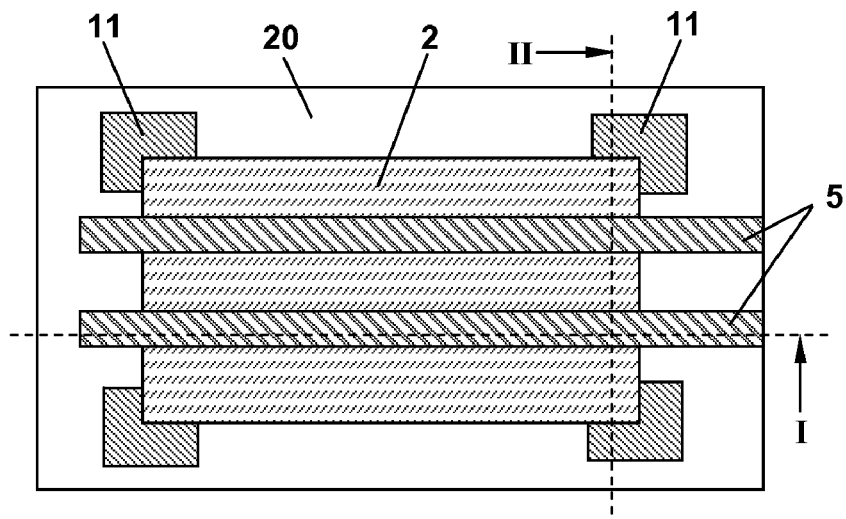
FIG. 1A shows a top view of a conventional SOI substrate structure containing silicon pillars at edges of a device region.
Figure 1B:
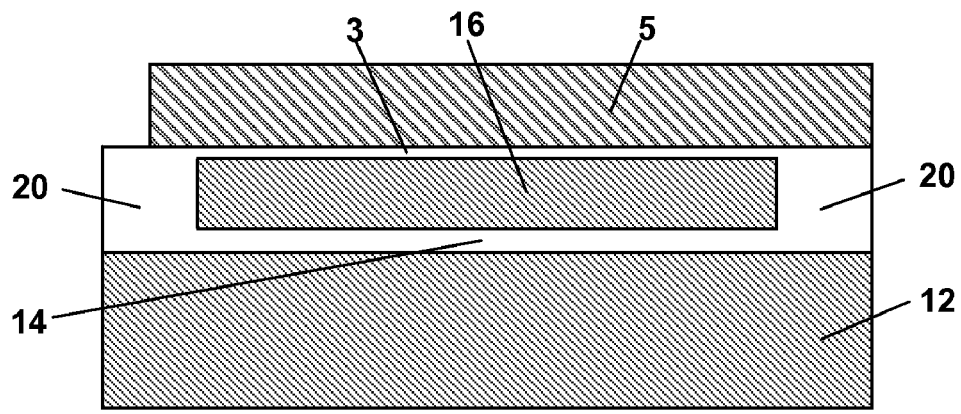
FIG. 1B shows a cross-sectional view of the conventional SOI substrate structure of FIG. 1A along line I.
Figure 1C:
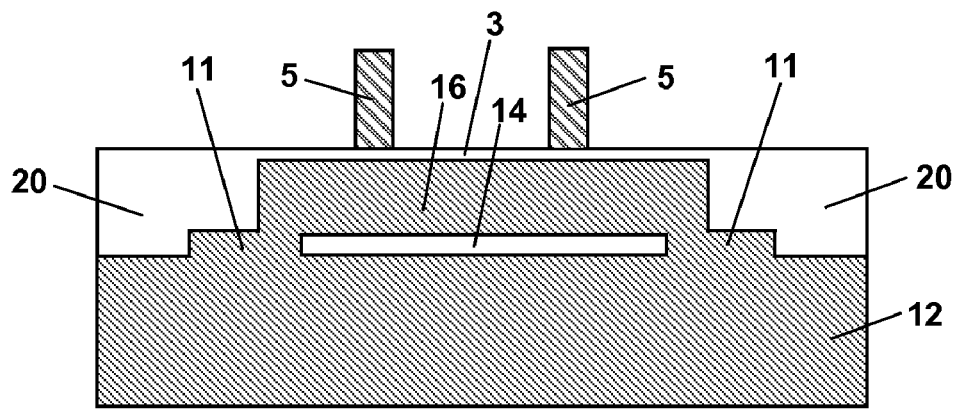
FIG. 1C shows a cross-sectional view of the conventional SOI substrate structure of FIG. 1A along line II.
Figure 2A:
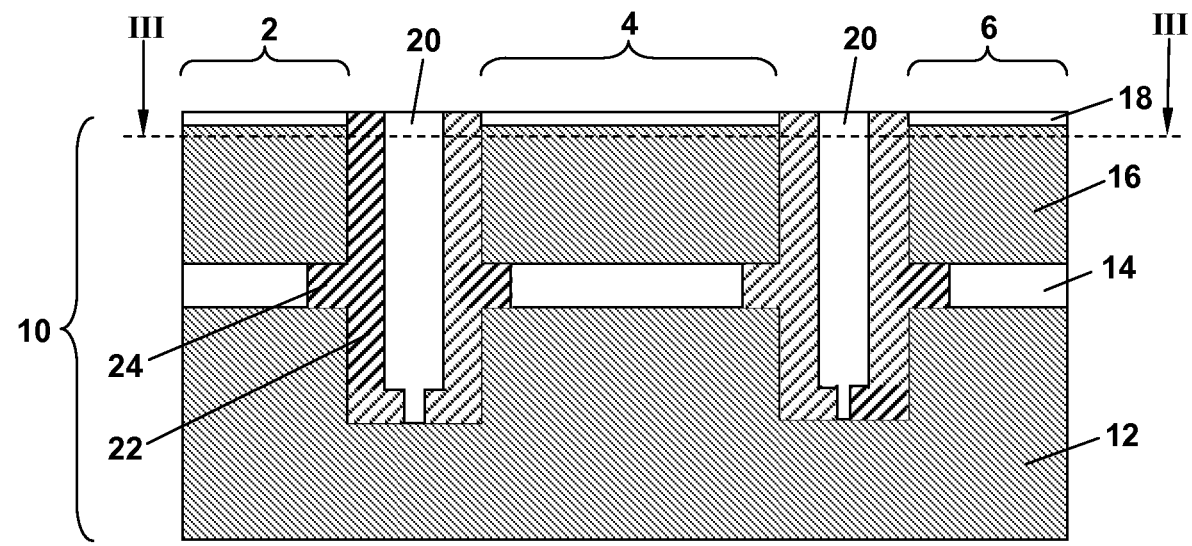
FIG. 2A shows a cross-sectional view of an exemplary SOI substrate structure containing vertical insulating pillars with ledges, according to one embodiment of the present invention.
Figure 2B:
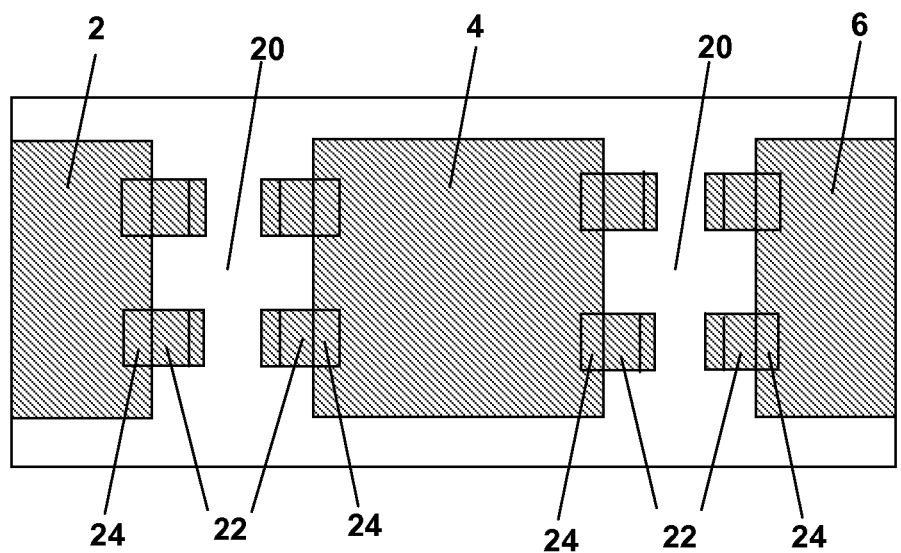
FIG. 2B shows a top view of the exemplary SOI substrate structure of FIG. 2A.

FIG. 2A shows a cross-sectional view of an exemplary SOI substrate structure, according to one embodiment of the present invention. Specifically, the SOI substrate 10 comprises three device regions 2, 4, and 6. Each of the device regions 2, 4, and 6 comprises at least, from the bottom to the top, a base semiconductor substrate layer 12, a buried insulator layer 14, and a semiconductor device layer 16. One or more vertical insulating pillars 22 are provided at edges of the device regions 2, 4, and 6 to provide structural support for the semiconductor device layer 16. Further, each vertical insulating pillar 22 has at least one ledge 24 that extends between the semiconductor device layer 16 and the base semiconductor substrate layer 12, as shown in FIG. 2A. A top view of the SOI substrate 10 along line III is provided in FIG. 2B.

The base semiconductor substrate layer 12 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it is preferred that the base semiconductor substrate layer 12 be composed of a Si-containing semiconductor material, i.e., a semiconductor material that includes silicon. Further, the base semiconductor substrate layer 12 may be doped, undoped, or contain both doped and undoped regions therein (not shown). Preferably, the base semiconductor substrate layer 12 is either undoped or slightly p-doped. Although the base semiconductor substrate layer 12 is preferably a bulk semiconductor structure, it may also include a layered structure with one or more buried insulator layers (not shown).

The buried insulator layer 14 may comprise any suitable insulator material(s), and it typically comprises an oxide, a nitride, or an oxynitride in either a crystalline phase or a non-crystalline phase. The buried insulator layer 14 may be a homogenous, continuous layer, or it may contain relatively large cavities or micro- or nano-sized pores (not shown). Physical thickness of the buried insulator layer 14 may vary widely depending on the specific applications, but it typically ranges from about 10 nm to about 500 nm, with from about 20 nm to about 200 nm being more typical.

The semiconductor device layer 16 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it is preferred that the semiconductor device layer 16 be composed of a Si-containing semiconductor material, i.e., a semiconductor material that includes silicon. Further, the semiconductor device layer 16 may be doped, undoped, or contain both doped and undoped regions therein (not shown). Preferably, the semiconductor device layer 16 is either undoped or slightly p-doped. Physical thickness of the semiconductor device layer 16 may vary widely depending on the specific applications, but it typically ranges from about 10 nm to about 200 nm, with from about 50 nm to about 100 nm being more typical.

The upper surfaces of the device regions 2, 4, and 6 are preferably coplanar with one another, thereby forming a substantially planar upper surface for the SOI structure 10. An optional surface protective layer 18 may be provided over the semiconductor device layer 16 to protect layer 16 during planarization. The optional surface protective layer 18 may comprise any suitable material(s) that can function as a planarization stop layer. Preferably, the optional surface protective layer 18 comprises silicon nitride and has a thickness ranging from about 40 nm to about 100 nm.

The vertical insulating pillars 22 may comprise any suitable insulator material(s), such as oxides, nitrides, or oxynitrides. In a particularly preferred, but not necessary, embodiment of the present invention, the vertical insulating pillars 22 comprise a conformal oxide material. Such an oxide material provides excellent structural support for the semiconductor device layer 16. Further, the thermal oxide material provides the conformability required for forming pillar structures 22 that adhere well to the sidewalls of the semiconductor device layer 16 and contain the ledges 24 extending between the semiconductor device layer 16 and the base semiconductor substrate layer 12.

One or more isolation regions 20 are typically formed in the SOI substrate 10 to provide isolation between adjacent device regions 2, 4, and 6. The isolation regions 20 may be a trench isolation region or a field oxide isolation region. Preferably, the isolation regions 20 are trench isolation regions formed by a conventional trench isolation process well known to those skilled in the art. For example, lithography, etching and filling of the trench with a trench dielectric may be used in forming the trench isolation regions 20. The dielectric material used for forming the trench can be any suitable dielectric material, and it is preferably a non-conformal dielectric material. Optionally, a liner may be formed in the trench prior to trench fill, a densification step may be performed after the trench fill and a planarization process may follow the trench fill as well. Alternatively, the isolation regions 20 are field oxide isolation regions formed utilizing a so-called local oxidation of silicon process.

The improved SOI substrate structure as described hereinabove can be readily formed from a bulk semiconductor substrate by a simplified method at reduced costs. Such a method will be illustrated in greater details hereinafter with reference to FIGS. 3-11.

Figure 3:
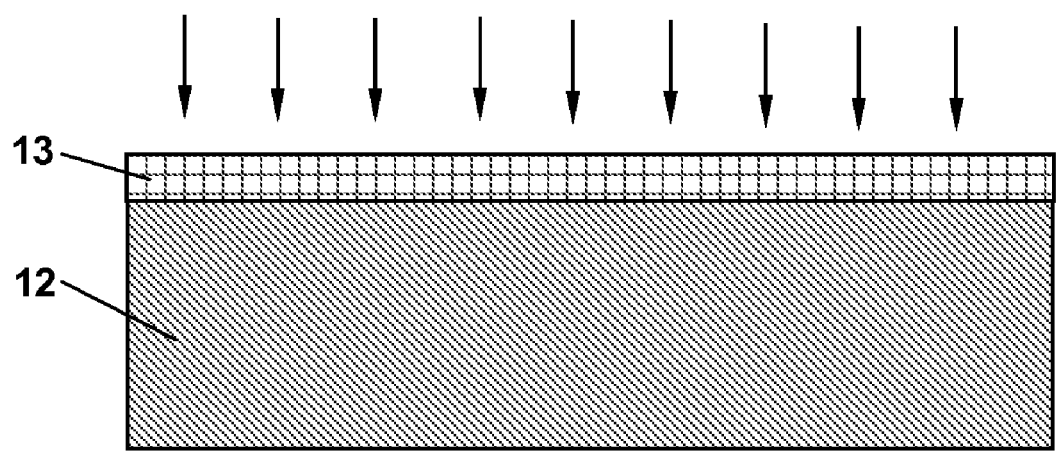
FIGS. 3-11 illustrate exemplary processing steps for forming an SOI substrate structure containing vertical insulating pillars with ledges, according to one embodiment of the present invention.

FIG. 3 shows a base semiconductor substrate layer 12, which may or may not contain any buried insulator layer. Preferably, the base semiconductor substrate layer 12 has a bulk semiconductor structure with no buried insulator layer therein and is either un-doped or slightly p-doped. A dopant implantation step is then carried out to implant an n-type dopant species into an upper surface of the base semiconductor substrate layer 12, thereby forming a sacrificial layer 13 that contains n-doped semiconductor. The sacrificial layer 13 can subsequently be removed by an etching step that selectively removes n-doped semiconductor over un-doped or slightly p-doped semiconductor for formation of a buried insulator layer (to be described hereinafter in greater detail).

In a specific, but non-limiting, example, the dopant implantation step is carried out at an energy level ranging from about 1 Kev to about 150 Kev and a dopant dose ranging from about 1E14 atm/cm$^2$ to about 1E16 atm/cm$^2$. Rapid thermal anneal (RTA) at an annealing temperature ranging from about 650° C. to about 1300° C. is subsequently performed in order to activate the dopant species in the n-doped semiconductor layer 13. The n-doped semiconductor layer 13 can also be formed by other doping techniques, such as solid-state diffusion from a doping layer or a vapor. The n-doped semiconductor sacrificial layer 13 so formed preferably comprises an n-type dopant species, such as phosphorus (P), arsenic (As), antimony (Sb), etc., at a concentration ranging from about $1 \times 10^{19}$/cm$^3$ to about $1 \times 10^{21}$/cm$^3$. Physical thickness of the sacrificial layer 13 is substantially the same as the buried insulator layer 14 to be formed. Preferably, the sacrificial layer has a thickness ranging from about 10 nm to about 500 nm, and more preferably from about 20 nm to about 200 nm.

Note that the sacrificial layer 13 is not limited to the above-described n-doped semiconductor, and it may also contain other materials that can be selectively removed over the base semiconductor substrate layer 12 underneath and the semiconductor device layer 16 to be formed atop. Other removable materials that can be used to form the sacrificial layer 13 include, but are not limited to: porous semiconductor, SiGe and SiGeC.

Figure 4:
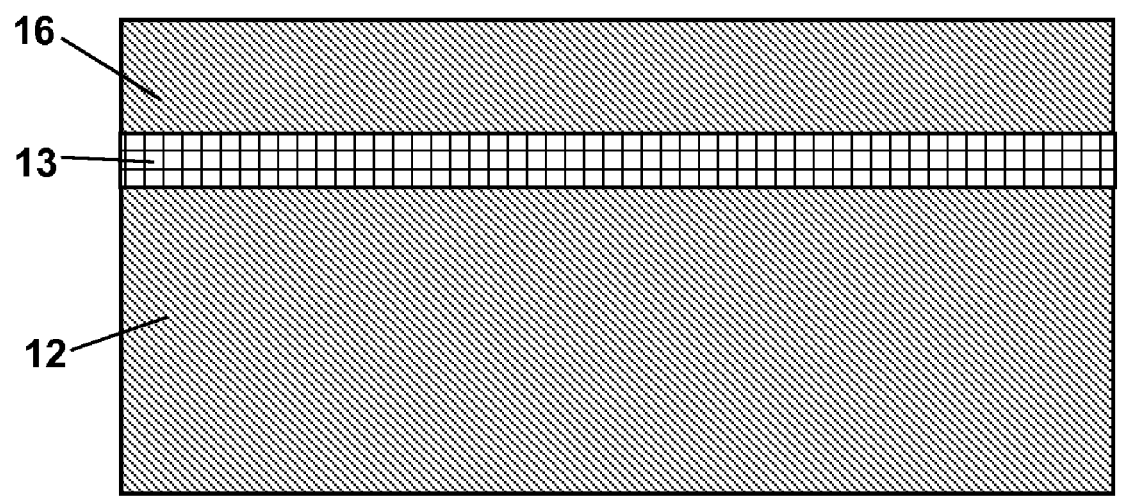
Figure 5:
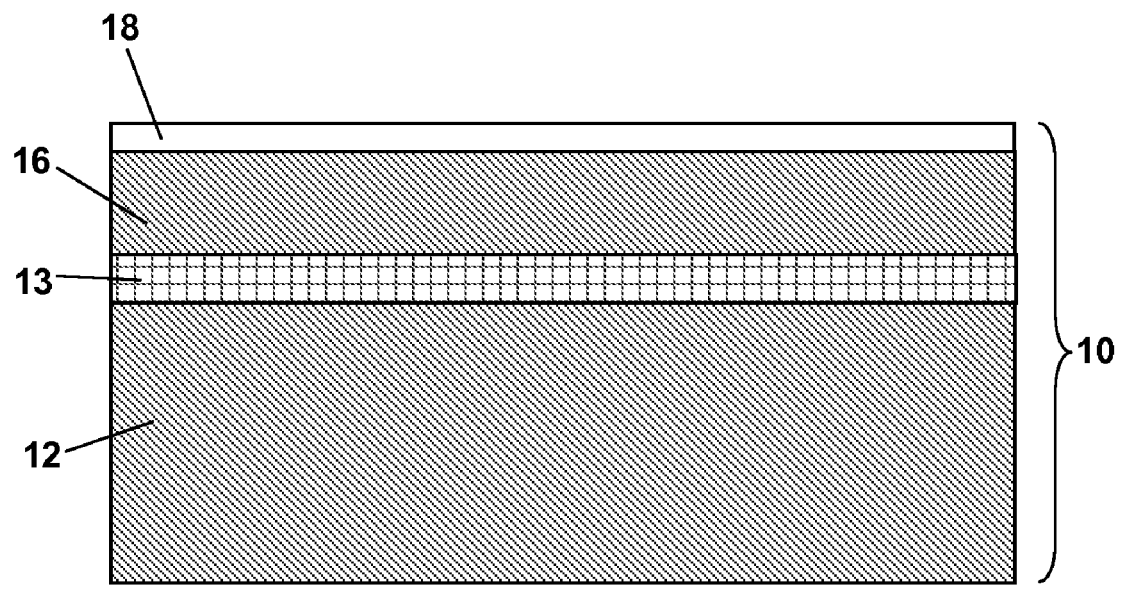

After formation of the sacrificial layer 13, a semiconductor device layer 16 is formed on top of the sacrificial layer 13 by epitaxial growth, as shown in FIG. 4. Consequently, the semiconductor device layer 16 has the same crystal structure and crystal plane orientation as the substrate (i.e., the sacrificial layer 13) it is grown on. An optional surface protective layer 18 can further be formed over the semiconductor device layer 16, as shown in FIG. 5.

Figure 6A:
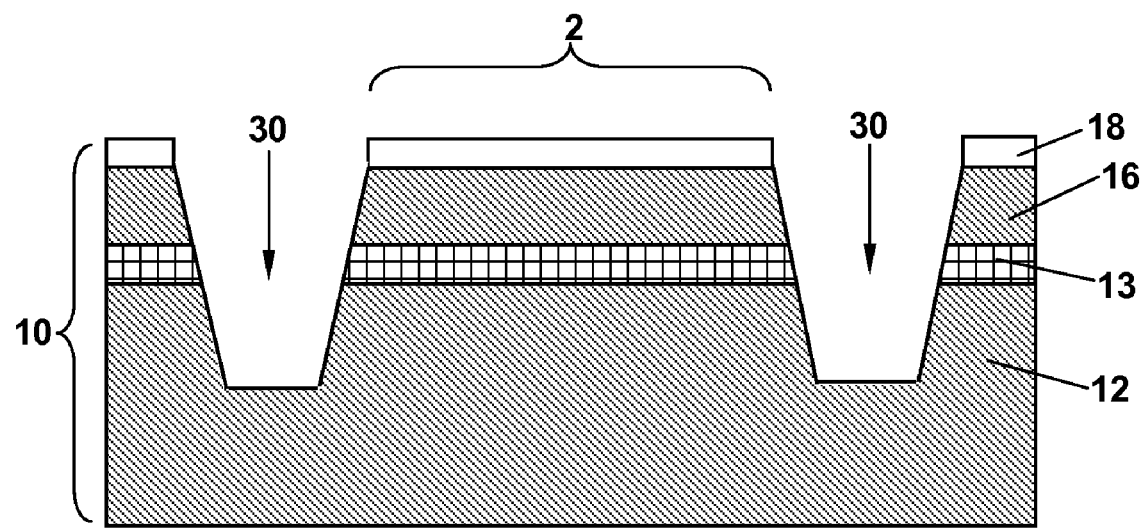
Figure 6B:
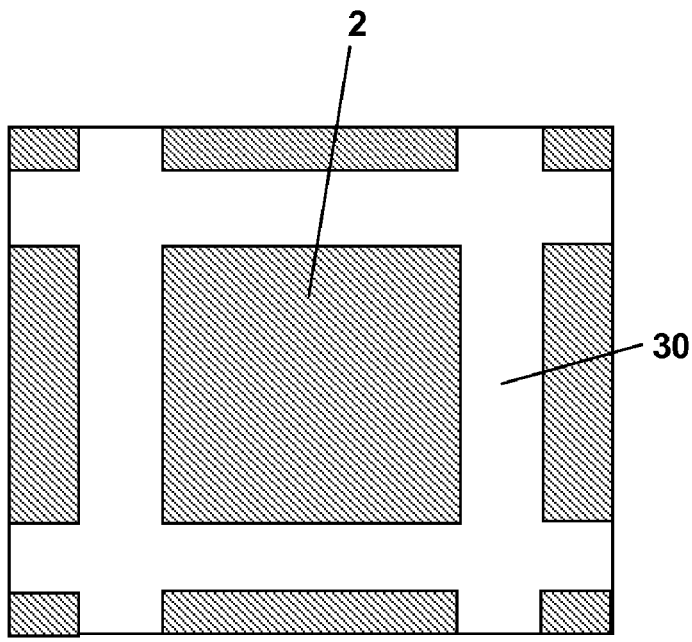

Subsequently, the layered substrate structure 10, which comprises the base semiconductor substrate layer 12, the sacrificial layer 13, the semiconductor device layer 16, and the optional surface protective layer 18, is patterned to form one or more device regions 2, which are defined by one or more isolation trenches 30, as shown in FIG. 6A. A top view of the patterned substrate structure 10 is shown in FIG. 6B.

Patterning of the layered substrate structure 10 can be carried out by first depositing a blanket dielectric hard mask layer (not shown) over the layered substrate structure 10, followed by conventional lithography and etching steps that pattern the layered substrate structure 10, as shown in FIG. 6A. Specifically, the lithography step includes applying a photoresist (not shown) onto the upper surface of the dielectric hard mask layer, exposing the photoresist to a desired pattern of radiation and developing the exposed photoresist utilizing a conventional resist developer. The pattern in the photoresist is then transferred to the dielectric mask layer and the layered substrate structure 10 utilizing one or more dry etching steps to form the one or more device regions 2 as shown in FIGS. 6A and 6B. In some embodiments, the patterned photoresist may be removed after the pattern has been transferred into the dielectric mask layer, and the dielectric mask layer is subsequently removed after etching of the layered substrate structure 10 has been completed. In other embodiments, the patterned photoresist and the dielectric mask layer are both removed after etching has been completed.

Figure 7:
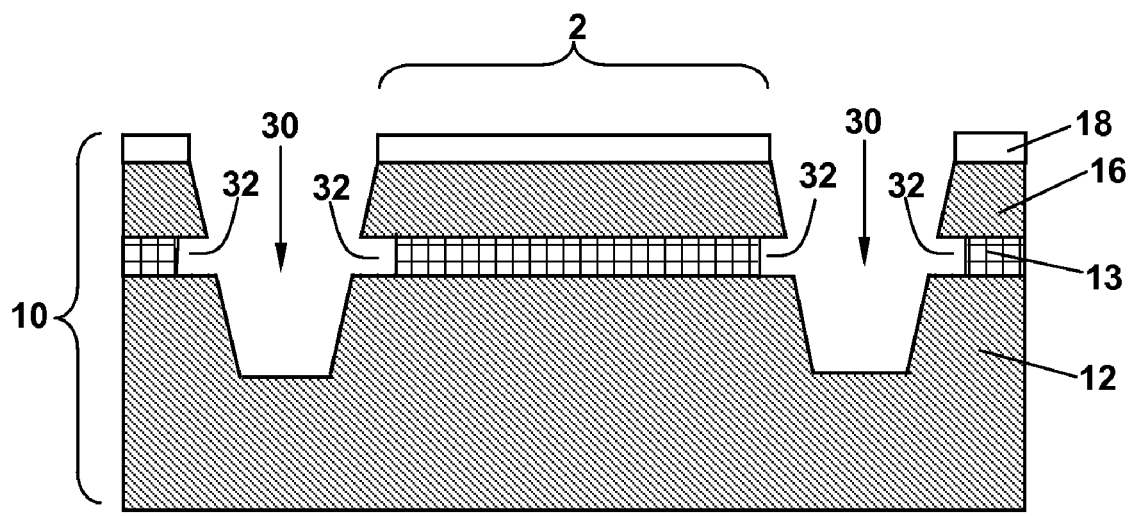

Subsequently, a lateral etching step is carried out to selectively remove a peripheral portion of the sacrificial layer 13 through sidewalls of the isolation trenches 30 to form recess 32 on the trench sidewalls, as shown in FIG. 7. When the sacrificial layer 13 comprises an n-doped semiconductor material, as described hereinabove, the lateral etching step is preferably carried out using a plasma etching step to selectively etch the n-doped semiconductor material contained by the sacrificial layer 13 over the un-doped or slightly p-doped semiconductor material contained by the base semiconductor substrate layer 12 and the semiconductor device layer 16. Chlorine- and/or bromine-based plasma chemistries can be used to achieve a selectivity of n-doped silicon over undoped or slightly p-doped silicon as high as about 500:1. An example of a plasma etch tool capable of performing such a lateral etching step is a 9400 inductively coupled plasma source (ICP) plasma etch tool manufactured by LAM Research Corp. (Fremont, Calif.). In an ICP tool, two radio-frequency (RF) power sources are used, which include an upper power source for generating a plasma and a lower power source for maintaining etch bias. Other ICP systems such as those manufactured by Applied Materials (Santa Clara, Calif.) or Tokyo Electron Limited (Tokyo, Japan) may also be used.

Alternatively, the lateral etching step can also be carried out using wet etching for selective removal of the n-doped semiconductor material in the sacrificial layer 13.

Figure 8:
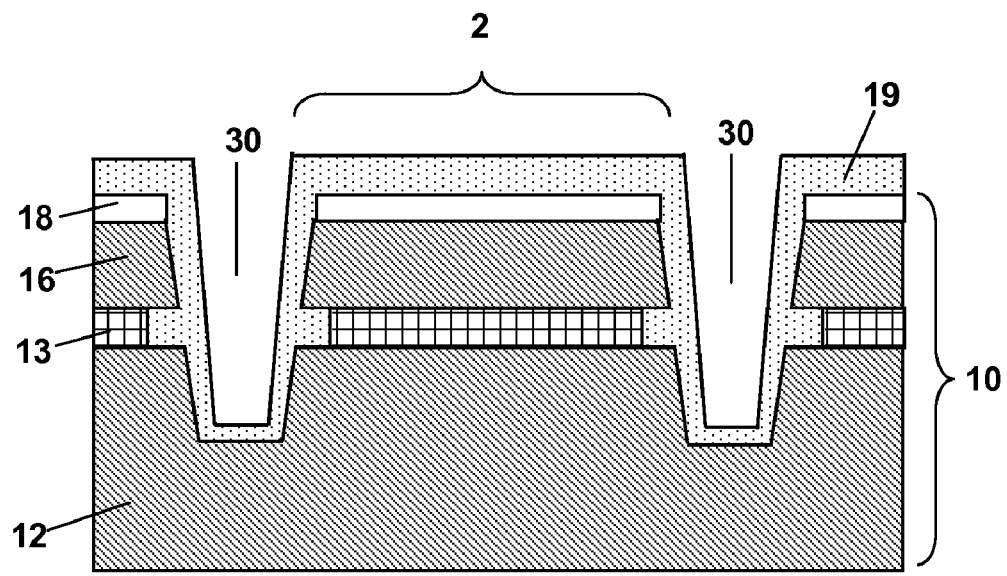

Next, a conformal insulator layer 19 is deposited over the entire structure of FIG. 7, including both the sidewalls of the isolation trenches 30 and the upper surface of the device region 2. A portion of the conformal insulator layer 19 fills the recess 32 on the trench sidewalls, thereby forming a ledge-like structure between the base semiconductor substrate layer 12 and the semiconductor device layer 16, as shown in FIG. 8.

The conformal insulator layer 19 may comprise any suitable insulator material(s), such as oxides, nitrides, or oxynitrides, and it can be formed by a thermal growth process such as, for example, oxidation, nitridation or oxynitridation. Alternatively, the conformal insulator layer 19 can be formed by a deposition process such as, for example, chemical vapor deposition (CVD), plasma-assisted CVD, atomic layer deposition (ALD), evaporation, reactive sputtering, chemical solution deposition and other like deposition processes. In a particularly preferred, but not necessary, embodiment of the present invention, the conformal insulator layer 19 comprises a conformal oxide material.

Figure 9A:
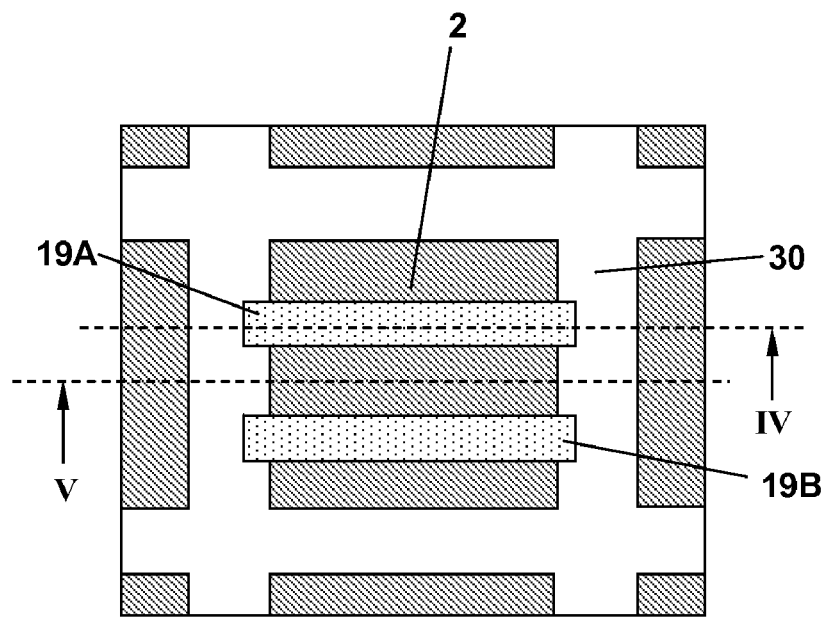

The conformal insulator layer 19 is then patterned by conventional lithography and etching to form one or more insulator strips 19A over each device region 2, as shown in FIG. 9A. Specifically, the lithography step includes applying a photoresist (not shown) over the conformal insulator layer 19, exposing the photoresist to a desired pattern of radiation (which defines the areas where the insulator strips 19A are to be formed) and developing the exposed photoresist utilizing a conventional resist developer. The pattern in the photoresist is then transferred to the conformal insulator layer 19 utilizing one or more wet and/or dry etching steps to form the one or more insulator strips 19A as shown in FIG. 9A. When the surface protective layer 18 comprises a nitride and the conformal insulator layer comprises an oxide, a wet etching solution comprising hydrofluoric acid (HF) can preferably be used to selectively remove unmasked portions of the conformal insulator layer 19 and stop at the surface protective layer 18.

Figure 9B:
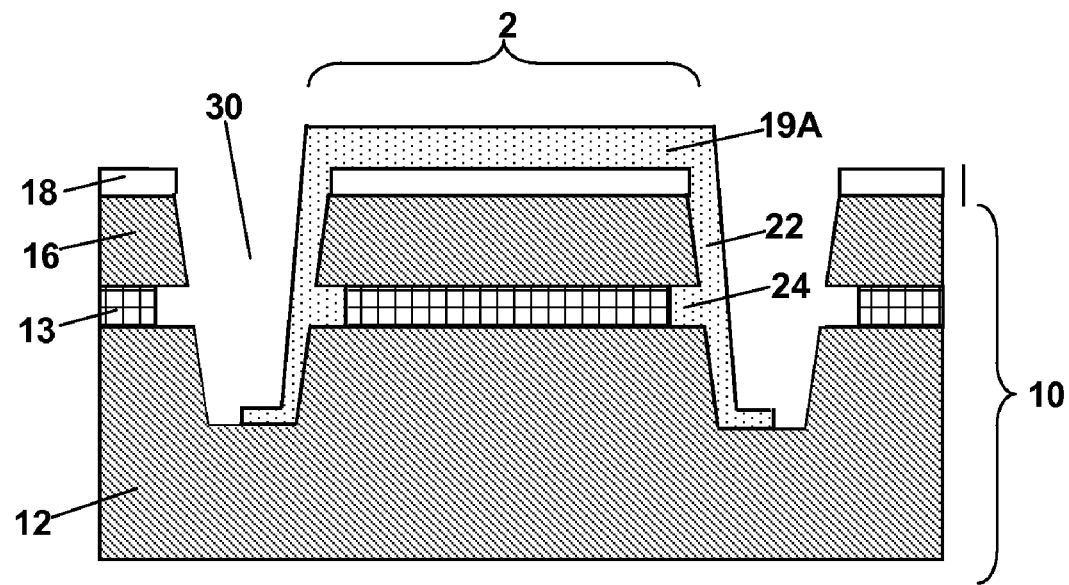

FIG. 9B shows a cross-sectional view of one of the device regions 2 alone Line IV that extends through one of the insulator strips 19A. The insulator strip 19A contains at least a horizontal portion that cover an upper surface of the device region 2 and at least a vertical portion that covers a sidewall of one of the isolation trenches 30, as shown in FIG. 9B. The vertical portion of the insulator strip 19A therefore forms at least a vertical insulator pillar 22 that adheres to sidewalls of both the semiconductor device layer 16 and the base semiconductor substrate layer 12. Further, a portion of the vertical insulator pillar 22 extends into the recess between the semiconductor device layer 16 and the base semiconductor substrate layer 12 to form a ledge 24.

Figure 9C:
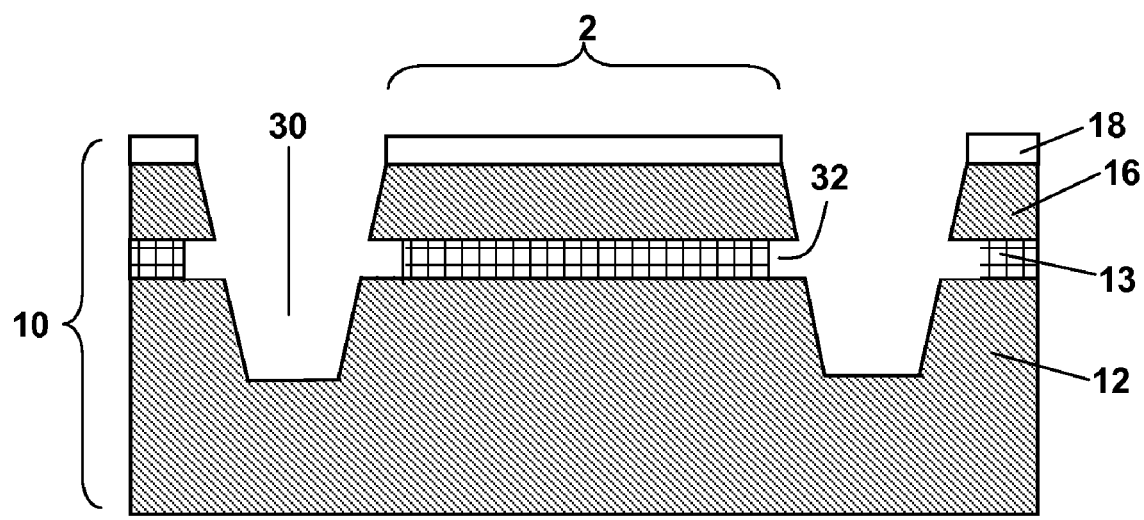

FIG. 9C shows a cross-sectional view of the device region 2 alone Line V that extends through an area that is not covered by any insulator strip. The sidewalls of the semiconductor device layer 16, the sacrificial layer 13, and the base semiconductor substrate layer 12 are still exposed in this area, and the recess 32 between the semiconductor device layer 16 and the base semiconductor substrate layer 12 remains unfilled in this area.

Figure 10A:
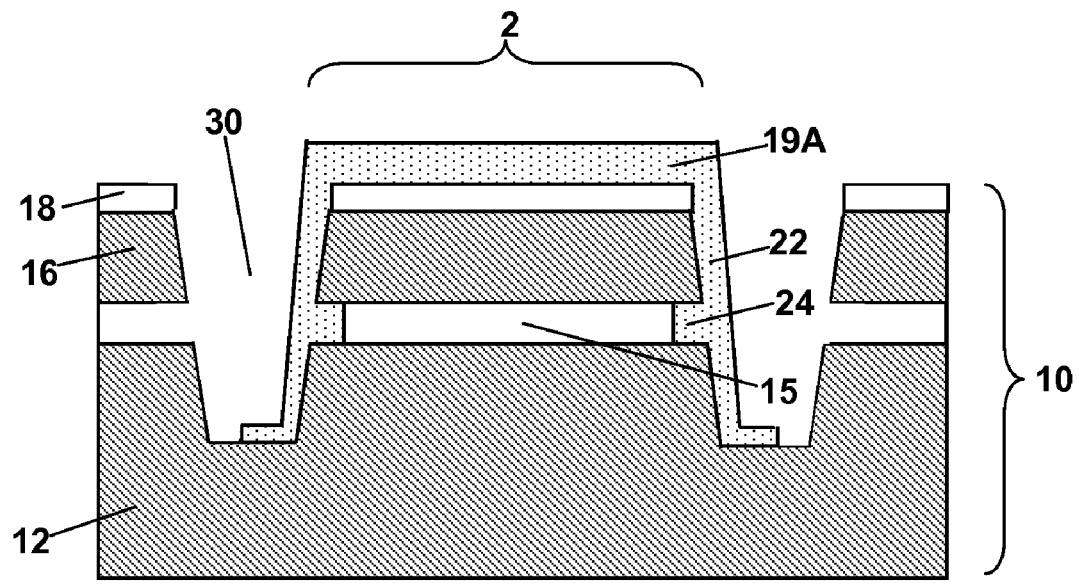
Figure 10B:
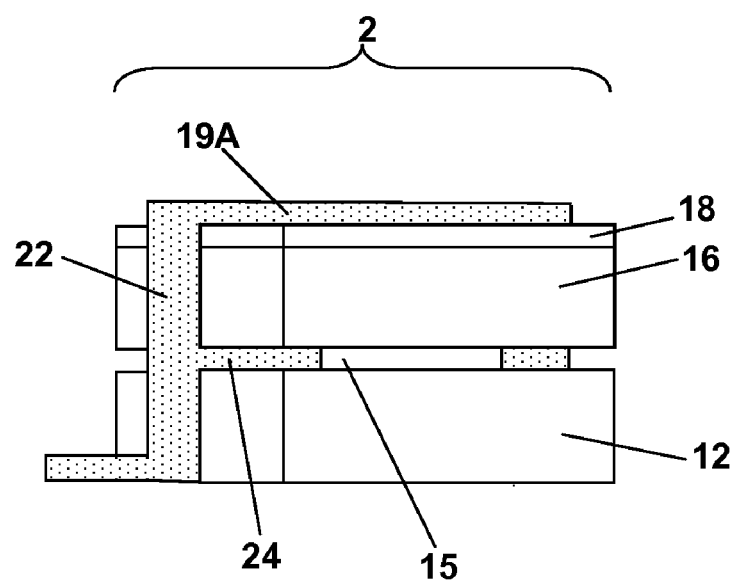
Figure 10C:
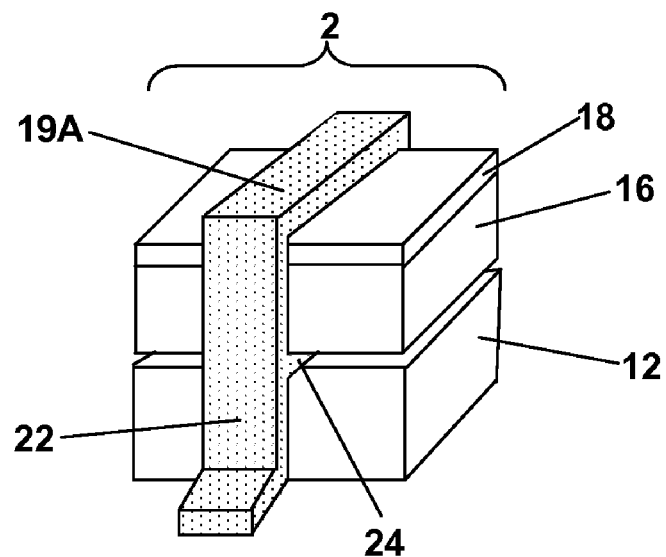

Subsequently, an additional lateral etching step, which is similar to that described hereinabove, is carried out to selectively remove the entire sacrificial layer 13 through exposed isolation trench sidewalls that are not covered by the insulator strips 19A. Consequently, an air gap 15 is formed between the base semiconductor substrate layer 12 and the semiconductor device layer 16, as shown in FIG. 10A. In this manner, the semiconductor device layer 16 becomes "floating" above the base semiconductor substrate layer 12. Structural support for the floating semiconductor device layer 16 is provided by the vertical insulator pillar 22 and its ledge 24. FIG. 10B shows a three-dimensional (3D) side view of the base semiconductor substrate layer 12, the floating semiconductor device layer 16, the insulator strip 19A, and the vertical insulator pillar 22 with the ledge 24, and FIG. 10C shows a 3D elevated view of these structures.

Figure 11:
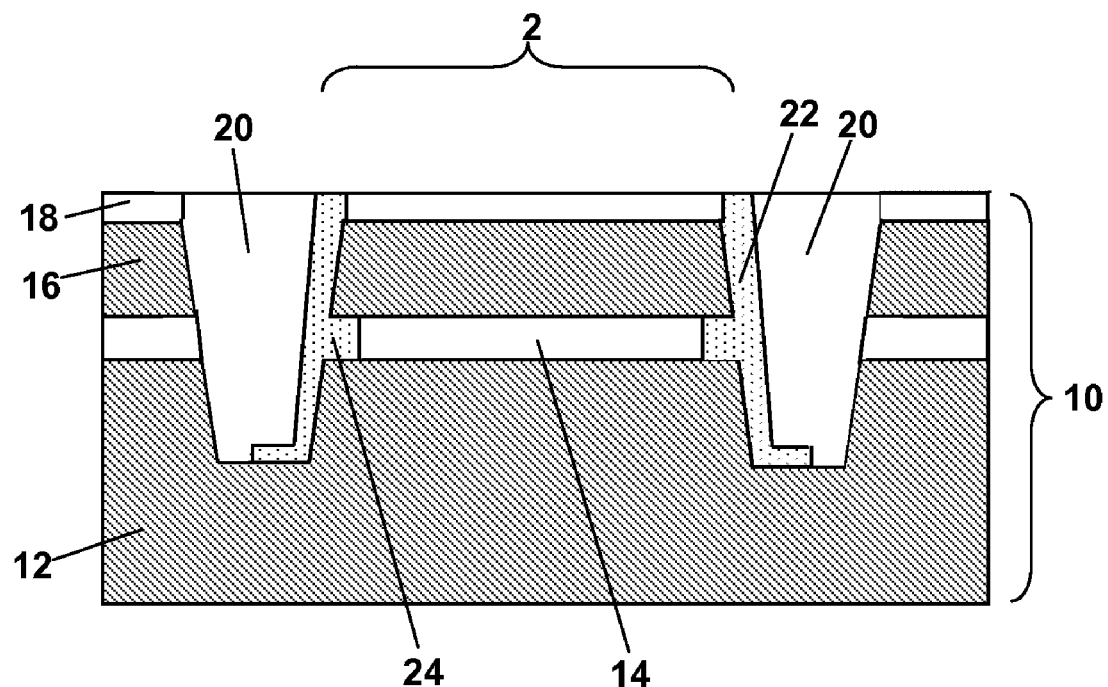

After the additional lateral etching step, the air gap 15 between the base semiconductor substrate layer 12 and the semiconductor device layer 16 is filled with an insulator material to form a buried insulator layer 14, as shown in FIG. 11. Any suitable insulator material, such as an oxide, nitride, or oxynitride, can be used for filling the air gap 15. Preferably, a high aspect ratio profile material commercialized by Applied Materials (Santa Clara, Calif.) under the trade name of HARP™ is used to fill the air gap 15 and form a continuous, homogeneous buried insulator layer 14. Alternatively, insulator materials of medium-to-low aspect ratio profiles can be used to form a buried insulator layer 14 with cavities therein. Further, the buried insulator layer 14 may comprise porous dielectric material(s) with micro- or nano-sized pores therein.

Next, the isolation trenches 30 are filled with a trench dielectric material to form trench isolations 20, and a planarization step such as chemical mechanical polishing (CMP) is then carried out to remove excess trench isolation material located outside of the trenches 30 and to remove the horizontal portion of the insulator strip 19A, thereby forming a SOI substrate structure 10 with a substantially planar upper surface, as shown in FIG. 11.

Note that while FIGS. 2-11 illustratively demonstrate exemplary SOI substrates and processing steps that can be used for forming such exemplary SOI substrates according to specific embodiments of the present invention, it is clear that a person ordinarily skilled in the art can readily modify the substrate structures and processing steps for adaptation to specific application requirements, consistent with the above descriptions. For example, although the exemplary SOI substrates as shown in FIGS. 2-3 and 11 contain specific numbers of vertical insulator pillars arranged in specific manners, it is readily understood that the SOI substrates of the present invention may comprise any number of vertical insulator pillars arranged in any manner. For another example, although FIGS. 3-4 shows formation of a layered substrate structure 10 by first forming a n-doped semiconductor sacrificial layer 13 via surface dopant implantation, followed by formation of the semiconductor device layer 16 via epitaxial growth of semiconductor, it is understood that such a layered substrate structure 10 may also be formed by a single in-depth dopant implantation step, which forms the n-doped semiconductor sacrificial layer 13 at a predetermined depth in a bulk semiconductor substrate. In this manner, the portion of the bulk semiconductor substrate located underneath the layer 13 defines the base substrate layer 12, and the portion located above the layer 13 defines the semiconductor device layer 16. The subsequent epitaxial growth step is therefore not necessary.

Figure 12:
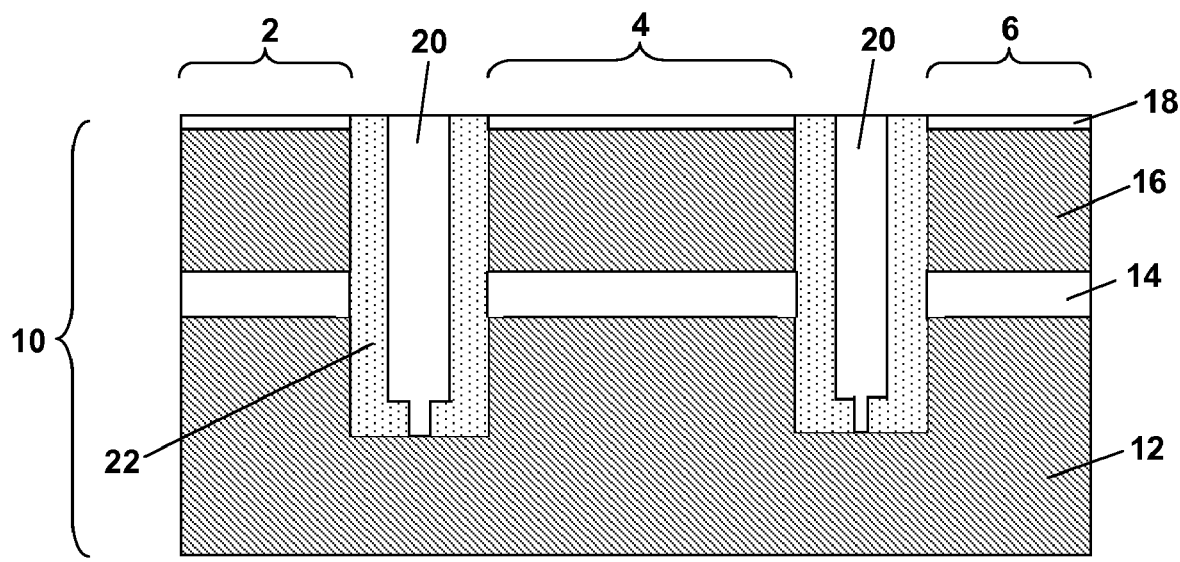
FIG. 12 shows a cross-sectional view of an exemplary SOI substrate structure containing vertical insulating pillars without ledges, according to one embodiment of the present invention.

Further, although FIGS. 2-3 and 11 show vertical insulator pillars with ledges, the vertical insulator pillars can also be provided without ledges in an alternative embodiment of the present invention. FIG. 12 shows an SOI substrate 10 having contains substantially the same structural components as that shown by FIG. 2, except that the vertical insulator pillars 22 in FIG. 12 do not have any ledge.

FIGS. 13-16 illustrate exemplary processing steps for forming an SOI substrate structure with such ledge-less vertical insulating pillars, according to an alternative embodiment of the present invention.

Figure 13:
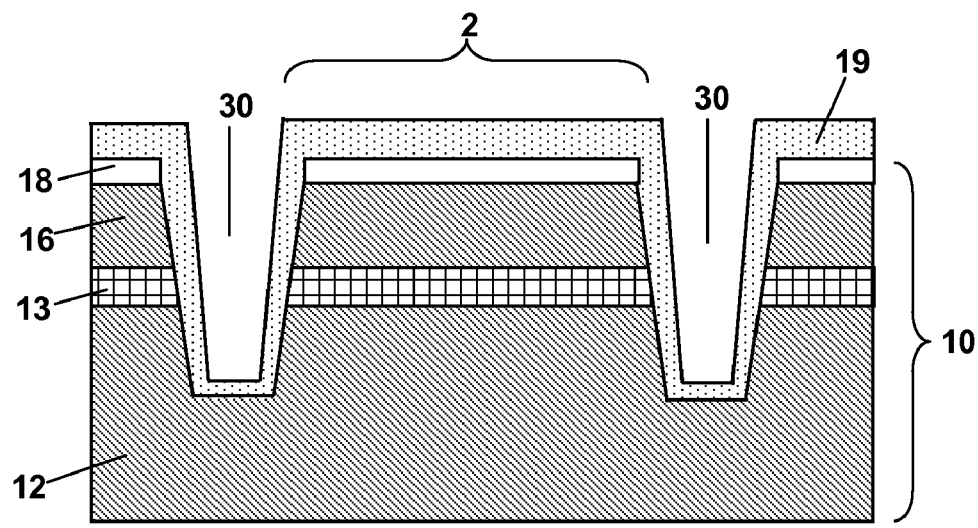
FIGS. 13-16 illustrate exemplary processing steps for forming an SOI substrate structure containing vertical insulating pillars without ledges, according to one embodiment of the present invention.

Specifically, after patterning of the layered substrate structure 10, as shown in FIGS. 6A and 6B, a conformal insulator layer 19 is deposited over the entire structure without the lateral etching step as described hereinabove in FIG. 7. In this manner, no recess is formed along sidewalls of the isolation trenches 30, and the conformal insulator layer 19 does not extend between the base semiconductor substrate layer 12 and the semiconductor device layer 16, as shown in FIG. 13.

Figure 14A:
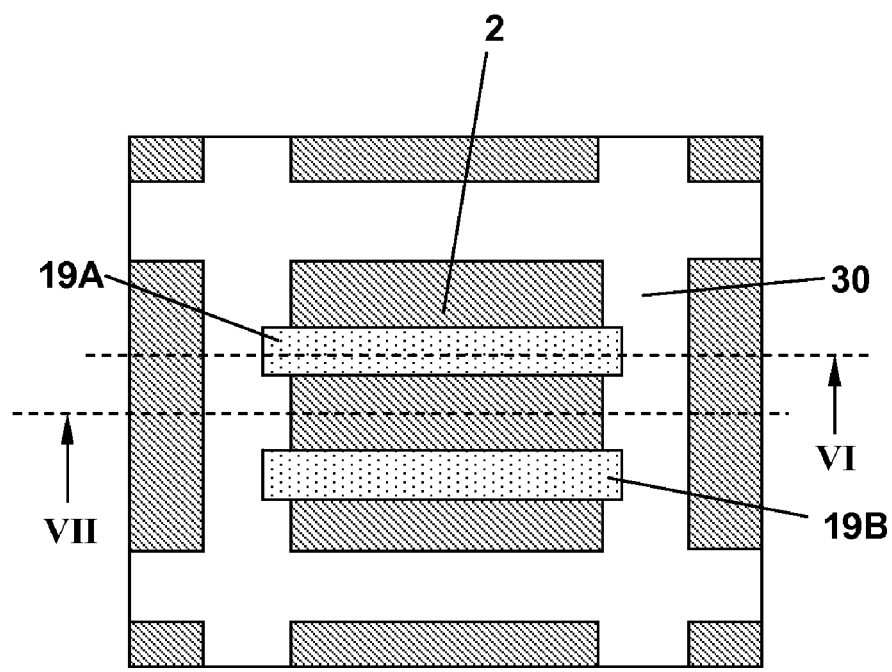

The conformal insulator layer 19 is then patterned by conventional lithography and etching to form one or more insulator strips 19A over each device region 2, as shown in FIG. 14A, similar to those descried hereinabove with reference to FIG. 9A.

Figure 14B:
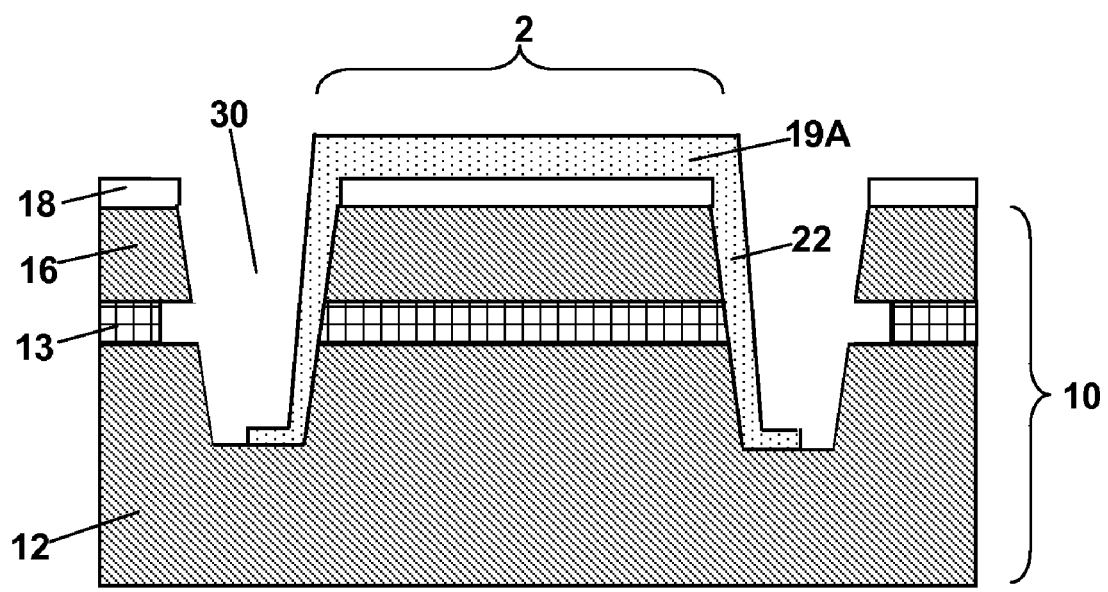

FIG. 14B shows a cross-sectional view of one of the device regions 2 along Line VI that extends through one of the insulator strips 19A. The insulator strip 19A contains at least a horizontal portion that cover an upper surface of the device region 2 and at least a vertical portion that cover a sidewall of one of the isolation trenches 30, as shown in FIG. 14B. The vertical portion of the insulator strip 19A therefore forms at least a vertical insulator pillar 22 that adheres to sidewalls of both the semiconductor device layer 16 and the base semiconductor substrate layer 12. Note that no ledge is formed along the vertical insulator pillar 22, as shown in FIG. 14B.

Figure 14C:
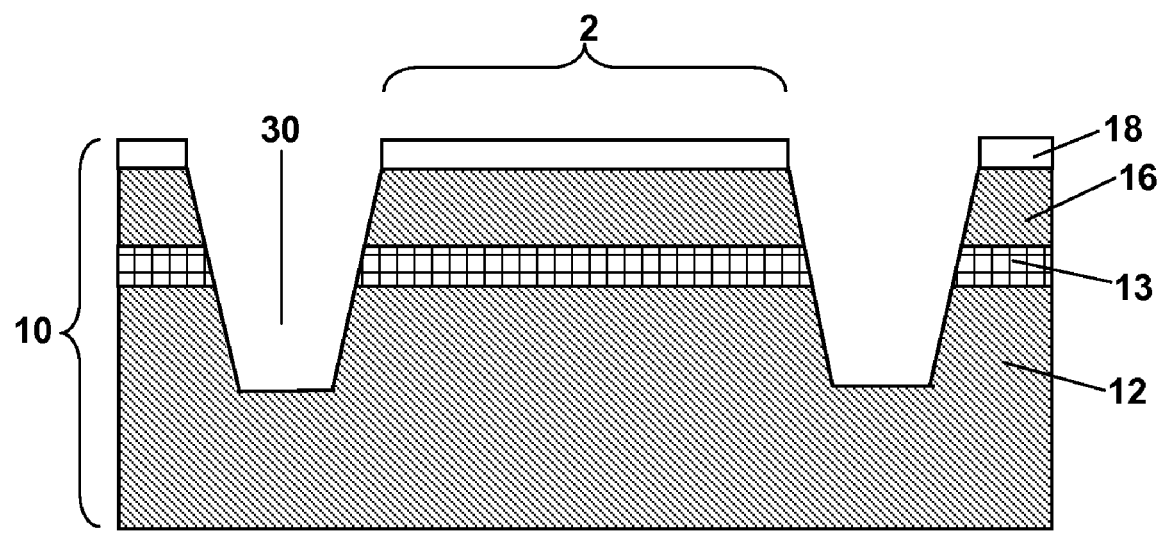

FIG. 14C shows a cross-sectional view of the device region 2 alone Line VII that extends through an area that is not covered by any insulator strip. The sidewalls of the semiconductor device layer 16, the sacrificial layer 13, and the base semiconductor substrate layer 12 remain exposed in this area.

Figure 15A:
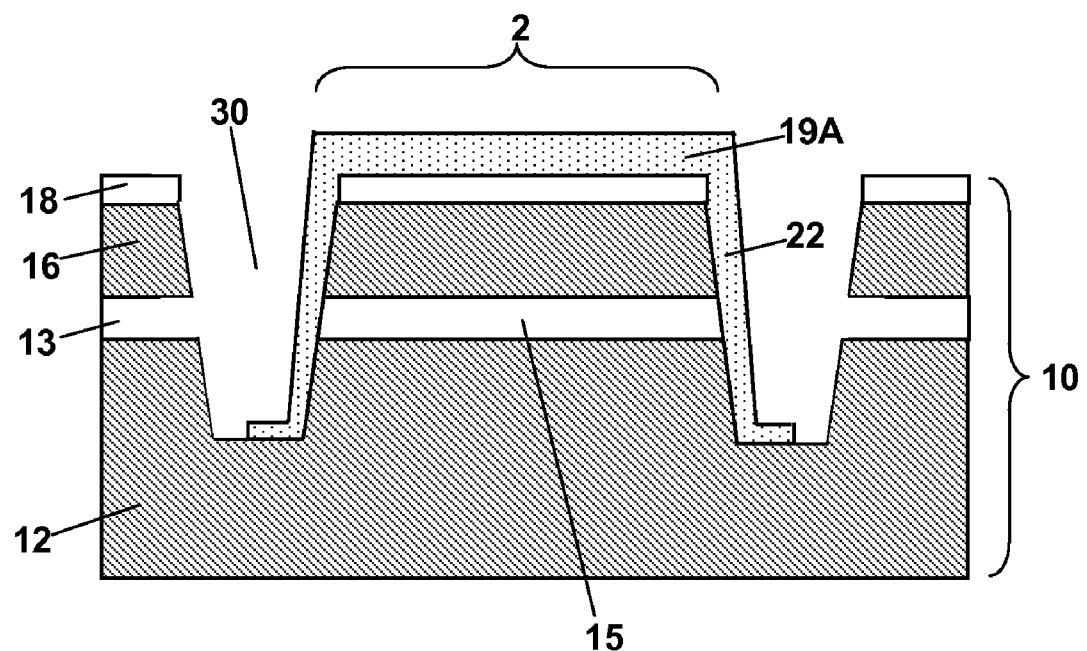
Figure 15B:
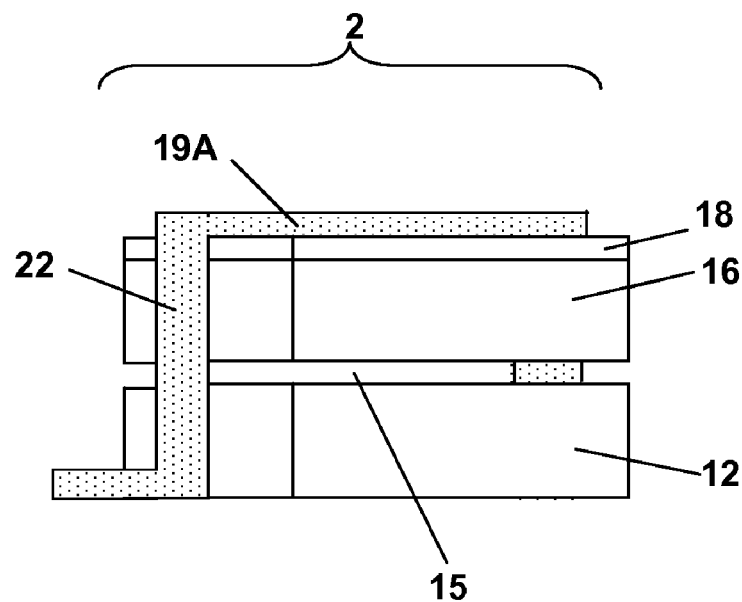
Figure 15C:
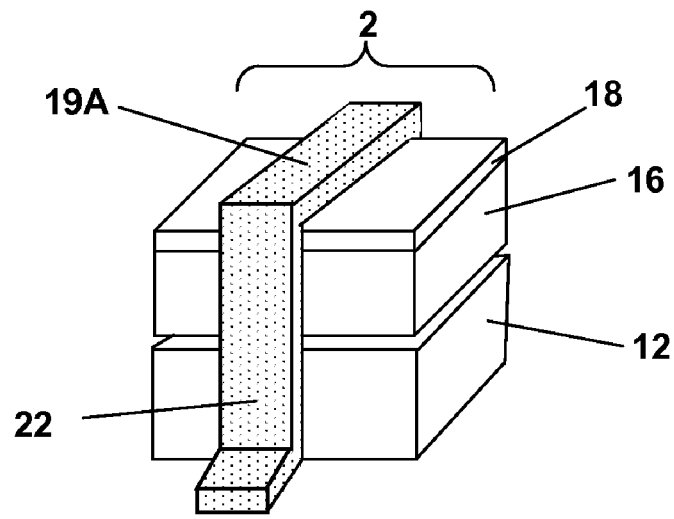

Subsequently, a lateral etching step similar to that described hereinabove is carried out to selectively remove the entire sacrificial layer 13 through exposed isolation trench sidewalls that are not covered by the insulator strips 19A. Consequently, an air gap 15 is formed between the base semiconductor substrate layer 12 and the semiconductor device layer 16, as shown in FIG. 15A. In this manner, the semiconductor device layer 16 becomes "floating" above the base semiconductor substrate layer 12. Structural support for the floating semiconductor device layer 16 is provided by the ledge-less vertical insulator pillar 22. FIG. 15B shows a three-dimensional (3D) side view of the base semiconductor substrate layer 12, the floating semiconductor device layer 16, the insulator strip 19A, and the ledge-less vertical insulator pillar 22, and FIG. 10C shows a 3D elevated view of these structures.

Figure 16:
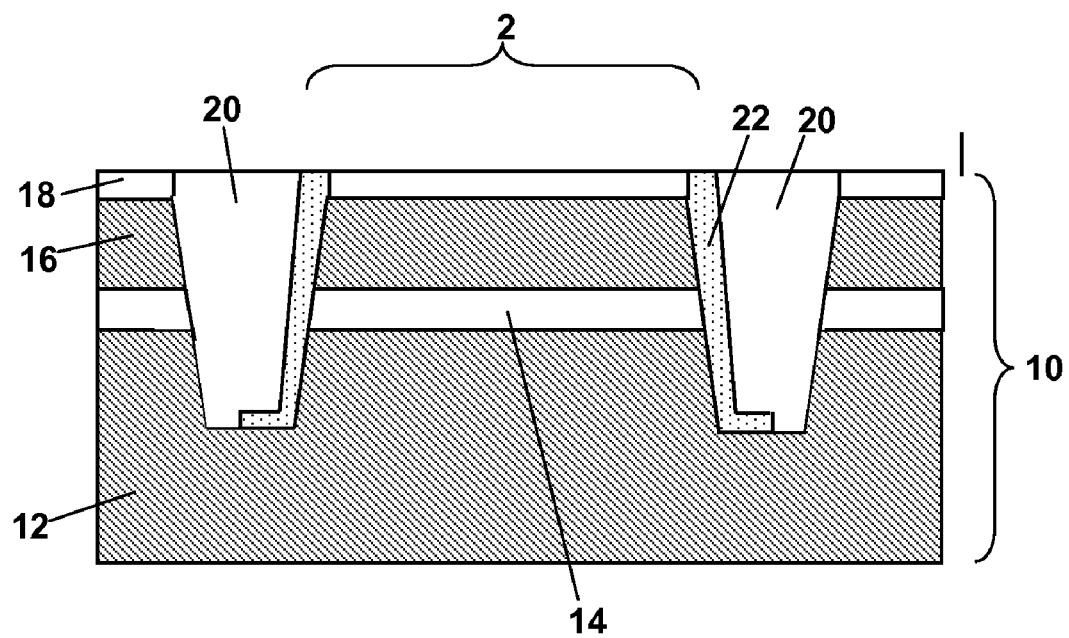

After the additional lateral etching step, the air gap 15 between the base semiconductor substrate layer 12 and the semiconductor device layer 16 is filled with an insulator material to form a buried insulator layer 14, and the isolation trenches 30 are filled with a trench dielectric material to form trench isolations 20. A CMP or other planarization step is carried out subsequently to remove excess trench isolation material located outside of the trenches 30 and to remove the horizontal portion of the insulator strip 19A, thereby forming a SOI substrate structure 10 with a substantially planar upper surface, as shown in FIG. 16.

The SOI substrates of the present invention as described hereinabove provide true SOI configurations in the entire active device regions and therefore offer full advantages of SOI structures. Further, the methods for fabricating such SOI substrates do not require perfect alignment of the vertical insulator pillars. Therefore, the device performance is no longer affected by potential alignment errors.

Figure 17:
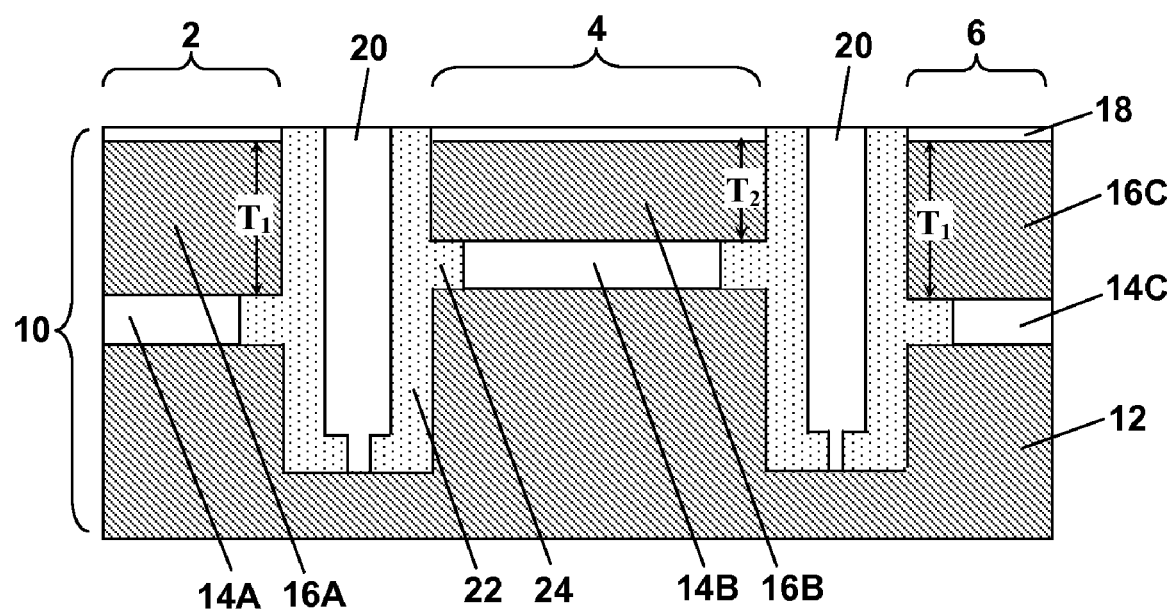
FIG. 17 shows a cross-sectional view of an exemplary SOI substrate structure containing semiconductor device layers of different thicknesses, while such semiconductor device layers are supported by vertical insulating pillars, according to one embodiment of the present invention.

In some embodiments, it is desirable to provide a SOI substrate with semiconductor device layers of different thicknesses in different device regions. Therefore, the present invention in a specific embodiment provides a SOI structure that comprises two or more device regions with semiconductor device layers of different thickness, as shown in FIG. 17. Specifically, the SOI substrate 10 comprises three device regions 2, 4, and 6, which respectfully contain semiconductor device layers 16A, 16B, and 16C and buried insulator layers 14A, 14B, and 14C. As shown in FIG. 17, the semiconductor device layers 16A and 16C have an average thickness ($T_1$) that is significantly larger than the average thickness ($T_2$) of layer 16B. Correspondingly, the buried insulator layers 14A and 14C are located at a depth that is larger than that of layer 16B.

The SOI structure of FIG. 17 can be readily formed by processing steps similar to those described hereinabove, except that a slightly different dopant implantation process will be used to form an unpatterned, layered substrate structure with a semiconductor device layer of varying thicknesses. In other words, the unpatterned, layered substrate structure contains an n-doped sacrificial semiconductor layer with different portions located at different depths of the substrate structure. Such an unpatterned, layered substrate structure can then be patterned to form two or more device regions with semiconductor device layers of different thicknesses.

FIGS. 18-23 illustrate an exemplary dopant implantation process containing at least two dopant implantation steps for formation of an n-doped sacrificial semiconductor layer with at least two portions located at two different depths of a layered substrate structure.

Figure 18:
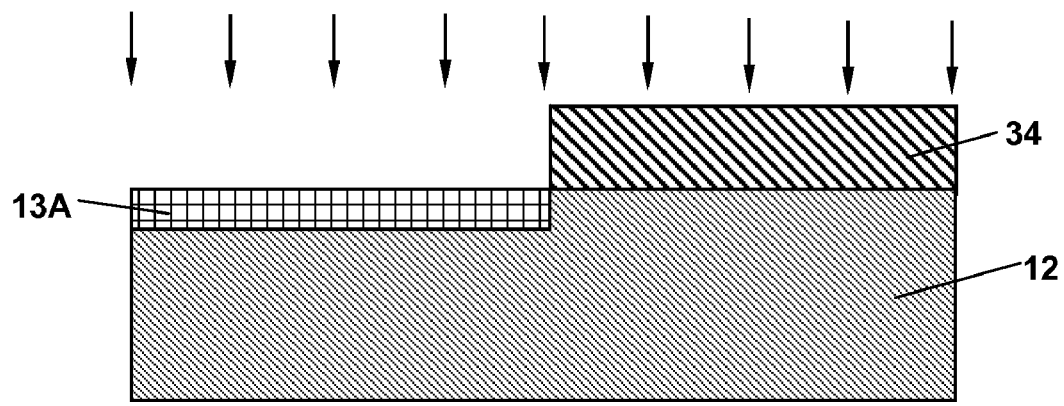
FIGS. 18-23 illustrate exemplary processing steps that can be used for forming an SOI substrate structure containing semiconductor device layers of different thicknesses, according to one embodiment of the present invention.

FIG. 18 shows a first masked dopant implantation step during which a first portion 13A of an n-doped sacrificial semiconductor layer is selectively formed over a first region of a base semiconductor substrate layer 12, while a second region of layer 12 is protected from the dopant implantation by a block mask 34.

Figure 19:
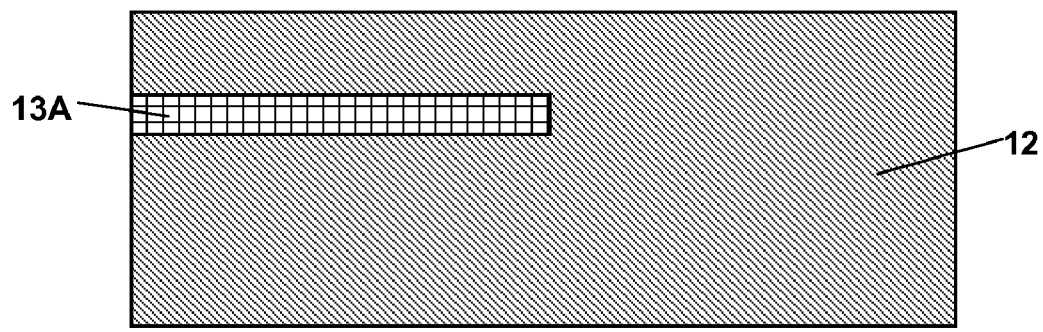

The block mask 34 is removed after the first dopant implantation step, and epitaxial growth of semiconductor material is carried out, so that the first portion 13A of an n-doped sacrificial semiconductor layer is buried in the subsequently grown epitaxial semiconductor material, as shown in FIG. 19.

Figure 20:
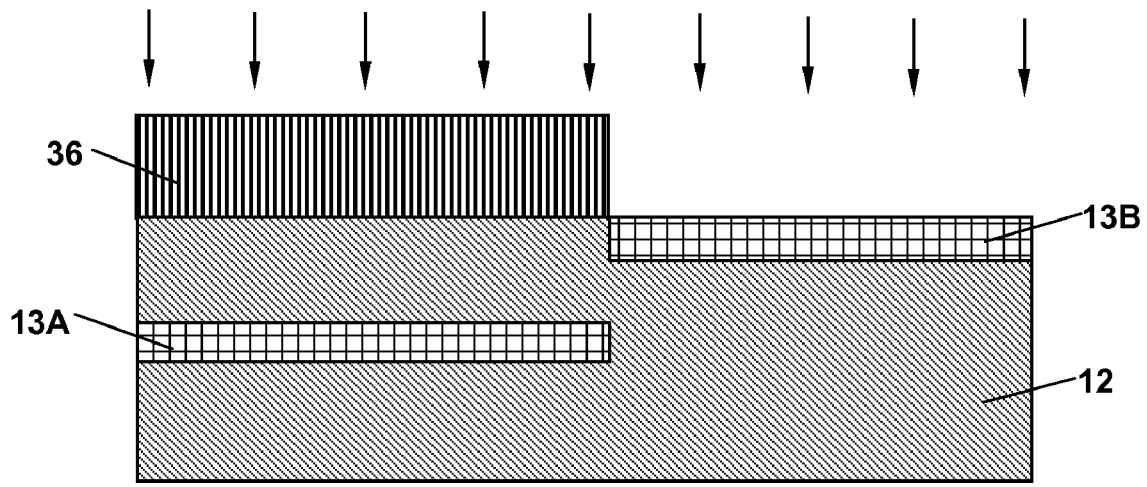

Next, a second masked dopant implantation step is carried out, during which the first region of the base semiconductor substrate layer 12 containing the first portion 13A of the n-doped sacrificial semiconductor layer is covered by another block mask 36, while a second portion 13B of the n-doped sacrificial semiconductor layer is formed over the second region of the base semiconductor substrate layer 12, as shown in FIG. 20.

Figure 21:
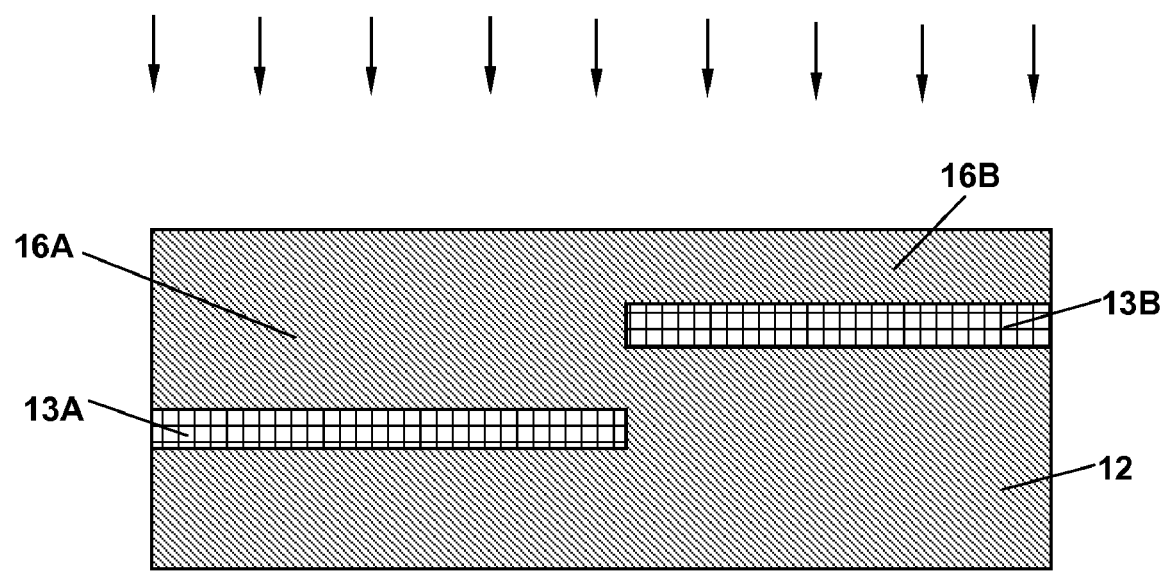

The block mask 36 is then removed after the second dopant implantation step, and epitaxial growth of semiconductor material is again carried out, so that the second portion 13B of the n-doped sacrificial semiconductor layer is also buried in epitaxial semiconductor material, as shown in FIG. 21. The subsequently grown epitaxial semiconductor material formed over the first portion 13A of the n-doped sacrificial semiconductor layer constitute a first, thicker portion 16A of a semiconductor device layer, and the epitaxial semiconductor material formed over the second portion 13B of the n-doped sacrificial semiconductor layer constitute a second, thinner portion 16B of the semiconductor device layer. An optional surface protective layer 18 can be formed over both portions 16A and 16B of the semiconductor device layer, thereby forming an unpatterned layered substrate 10, which contains a semiconductor device layer with two different portions 16A and 16B of different thicknesses, as shown in FIG. 22.

Figure 23:
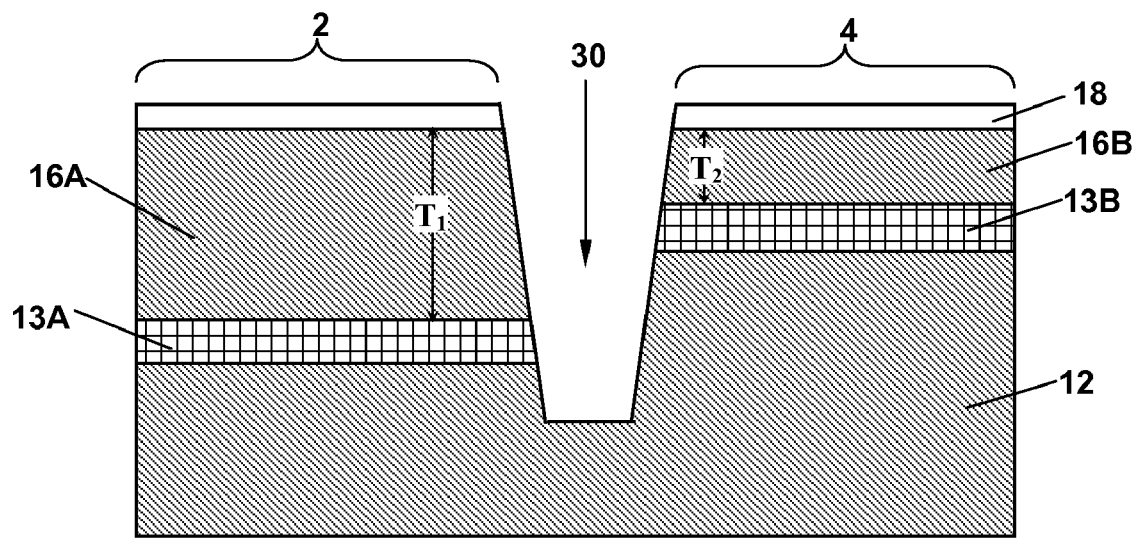

Such an unpatterned layered substrate 10 can then be patterned to form at least two different device regions 2 and 4 that are isolated from each other by an isolation trench 30 and contain two different semiconductor device layers 16A and 16B of different thicknesses ($T_1$ and $T_2$), as shown in FIG. 23.

Figure 22:
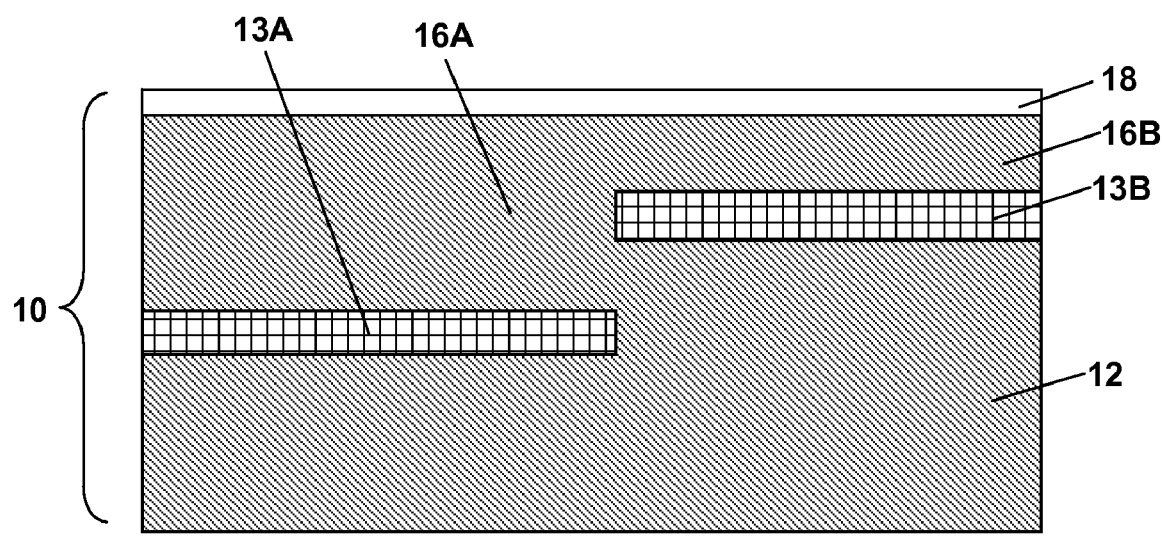

The unpatterned layered substrate 10 of FIG. 22 can also be formed by a single dopant implantation step. Specifically, a bulk semiconductor substrate is first provided, followed by selectively masking of a portion of the bulk semiconductor substrate. The thickness of the masking layer is adjusted so that it only retards the dopant implantation (i.e., reducing the implantation depth by a predetermined amount) but not completely block the dopant implantation in the remaining unmasked portion of the bulk semiconductor substrate. In this manner, a single dopant implantation step can be carried out to form an n-doped semiconductor sacrificial layer with different portions located at different depths of the bulk semiconductor substrate.

In some embodiments, it is desirable to provide a SOI substrate with semiconductor device layers of different thicknesses in different device regions. Therefore, the present invention in a specific embodiment provides a SOI structure that comprises two or more device regions with semiconductor device layers of different thicknesses, as shown in FIG. 17.

It has been recently discovered that a substrate with hybrid crystallographic orientation is particularly suitable for improving the device performance of complementary metal oxide semiconductor (CMOS) circuits. For example, electrons have a high mobility along the {100} crystal planes of silicon, but holes have high mobility along the {110} crystal planes of silicon. On one hand, hole mobility values along the {100} planes are roughly about 2 to 4 times lower than the corresponding electron hole mobility values along such planes. On the other hand, hole mobility values along the {110} silicon surfaces are about 2 times higher than those along the {100} silicon surfaces, but electron mobility along the {110} surfaces are significantly degraded compared to those along the {100} surfaces. Therefore, the {110} silicon surfaces are optimal for forming p-channel field effect transistor (p-FET) devices due to the excellent hole mobility along the {110} planes, which leads to higher drive currents in the p-FETs. However, such surfaces are completely inappropriate for forming n-channel field effect transistor (n-FET) devices. The {100} silicon surfaces instead are optimal for forming n-FET devices due to the enhanced electron mobility along the {100} planes, which results in higher drive currents in the n-FETs.

It is therefore desirable to provide a SOI substrate as described hereinabove but further with hybrid crystallographic orientations. Specifically, such a SOI substrate contains at least two device regions having semiconductor layers of different crystallographic orientations. When the semiconductor device layers in the at least two device regions comprise single crystal silicon, the different crystallographic orientations are preferably selected from the group consisting of <100>, <110>, and <111> orientations of silicon.

Figure 24:
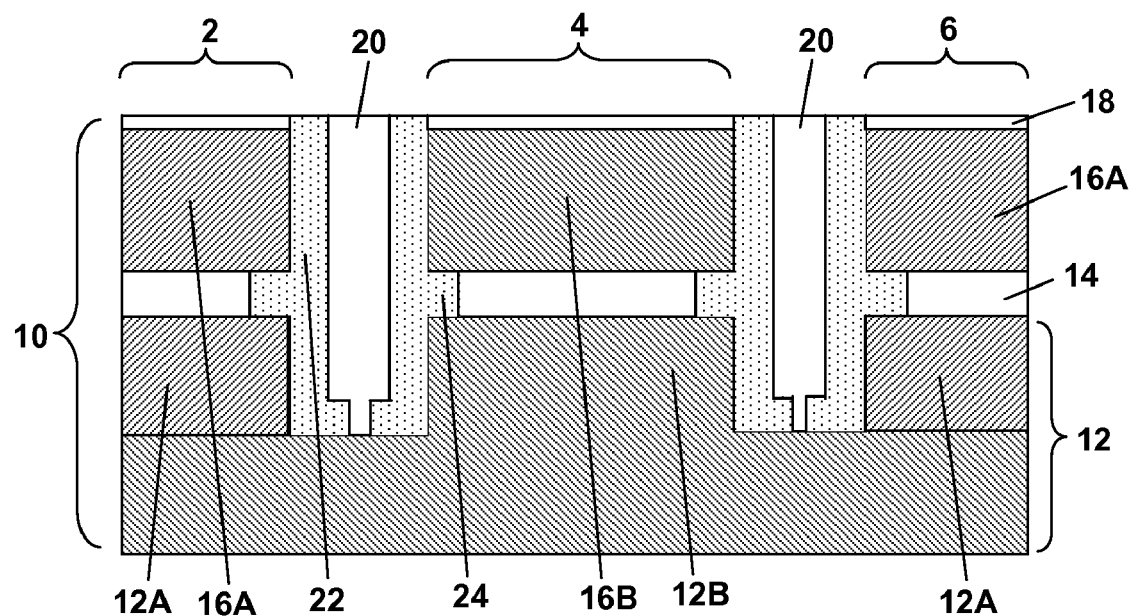
FIG. 24 shows a cross-sectional view of an exemplary SOI substrate structure containing semiconductor device layers of different crystallographic orientations, while such semiconductor device layers are supported by vertical insulating pillars, according to one embodiment of the present invention.

FIG. 24 shows such an SOI substrate 10, which comprises device regions 2, 4, and 6. The base semiconductor substrate layer 12 in the SOI substrate 10 have first portions 12A of a first crystallographic orientation, which are located in device regions 2 and 6, and second portions 12B of a second, different crystallographic orientation located in device region 4. Correspondingly, the semiconductor device layer 12 in the SOI substrate 10 also comprises first portions 16A of the first crystallographic orientation located in device regions 2 and 6 and second portions 16B of the second, different crystallographic orientation located in device region 4.

The SOI structure of FIG. 24 can be readily formed by processing steps similar to those described hereinabove, except that an unpatterned, layered substrate structure having a semiconductor device layer with different portions of different crystallographic orientations needs to be formed first, which can then be patterned to form two or more device regions with semiconductor device layers of different crystallographic orientations. Such an unpatterned, layered substrate structure can be readily formed using one or more wafer bonding, dopant implantation, amorphization implantation, recrystallization, and epitaxial growth steps.

FIGS. 25-30 illustrate an exemplary process for forming an unpatterned, layered substrate structure having a semiconductor device layer with different portions of different crystallographic orientations.

Figure 25:
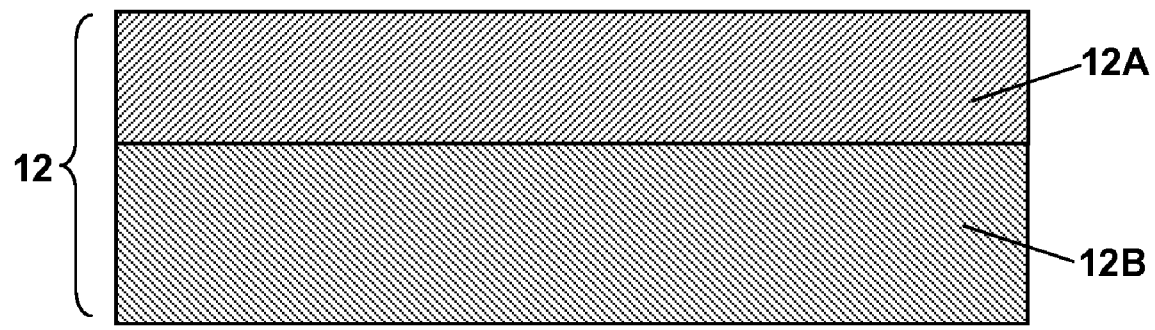
FIGS. 25-30 illustrate exemplary processing steps that can be used for forming an SOI substrate structure containing semiconductor device layers of different crystallographic orientations, according to one embodiment of the present invention.

A base semiconductor substrate layer 12 is first formed by bonding a first semiconductor layer 12A of a first crystallographic orientation onto a second semiconductor layer 12B of a second, different crystallographic orientation by known wafer bonding techniques, as shown in FIG. 25.

Figure 26:
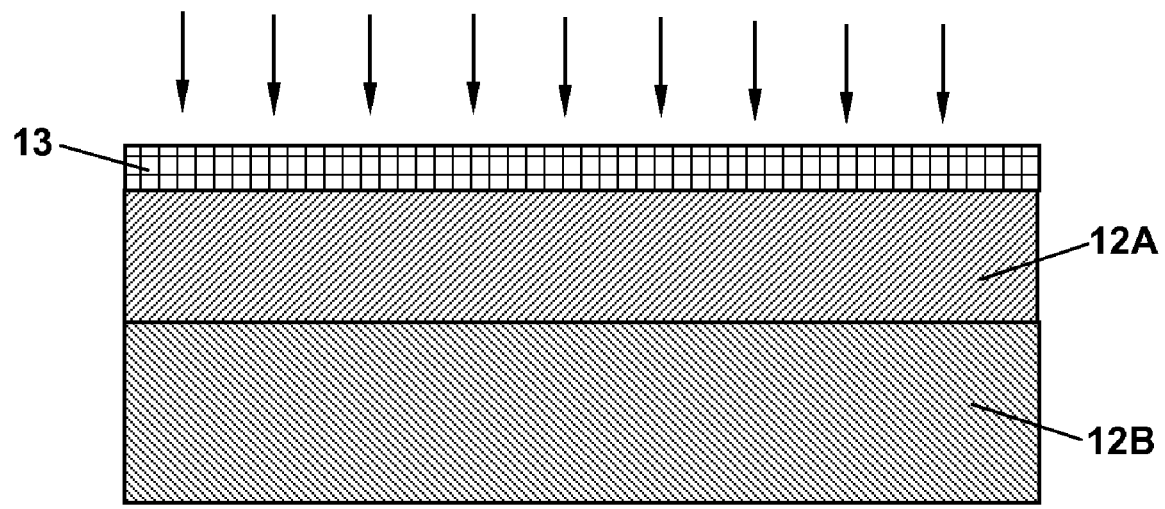

Next, a dopant implantation step is carried out to implant n-type dopant species onto an upper surface of the first semiconductor layer 12A to form an n-doped sacrificial semiconductor layer 13, as shown in FIG. 26.

Figure 27:
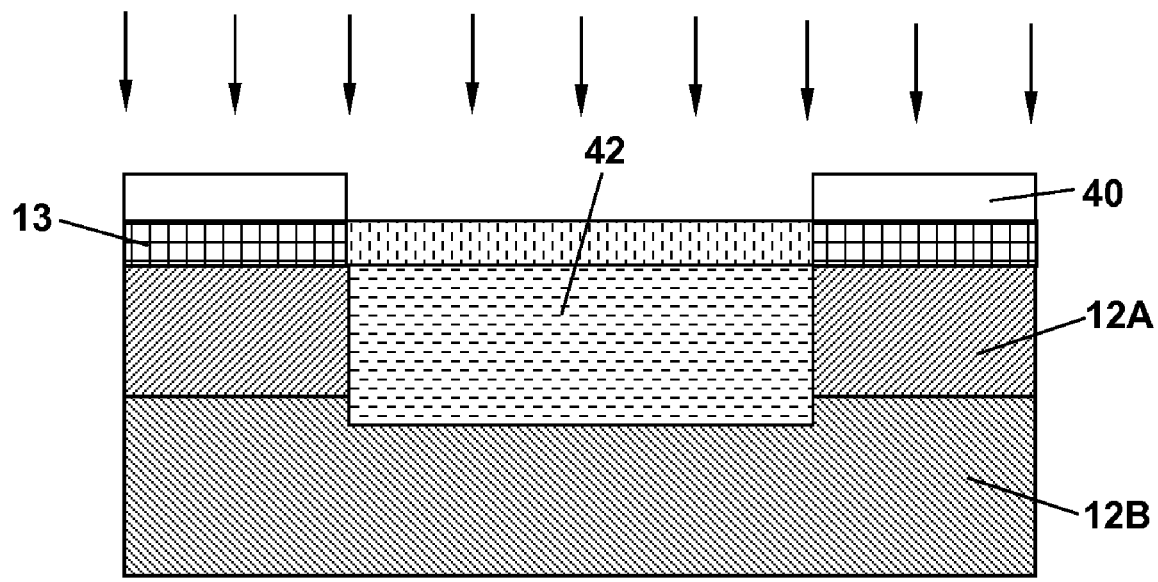

A masked amorphization implantation step is then carried out using block mask 38 to form at least one amorphous semiconductor region 40, which extends through the n-doped sacrificial semiconductor layer 13 and the first semiconductor layer 12A into the second semiconductor layer 12B, as shown in FIG. 27. An upper portion of the amorphous semiconductor region 40 contains n-type dopant species that have been previously implanted.

Figure 28:
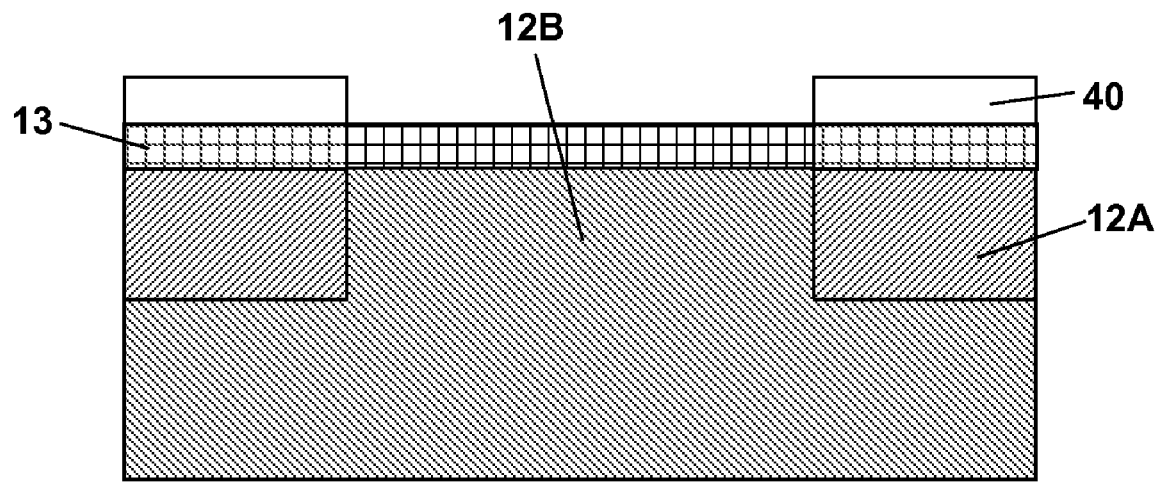

Recrystallization of the amorphous semiconductor region 40 over the second base semiconductor layer 12B forms a recrystallized region that is an extension of layer 12B and therefore has the same crystallographic orientation as layer 12B (i.e., the second, different crystallographic orientation). An upper portion of the recrystallized region contains n-doped semiconductor of the second, different crystallographic orientation, as shown in FIG. 28.

Subsequently, the block mask 40 is removed, and epitaxial growth of semiconductor is carried out to form a semiconductor device layer that contains first portions 16A grown over the first base semiconductor substrate layer 12A outside the recrystallized region 12B and a second portion 16B grown over the recrystallized region 12B. In this manner, the first portions 16A of the semiconductor device layer has the same crystallographic orientation as that of the first base semiconductor substrate layer 12A (i.e., the first crystallographic orientation), and the second portion 16B of the semiconductor device layer has the same crystallographic orientation as that of the recrystallized region 12B (i.e., the second, different crystallographic orientation), as shown in FIG. 29.

Figure 29:
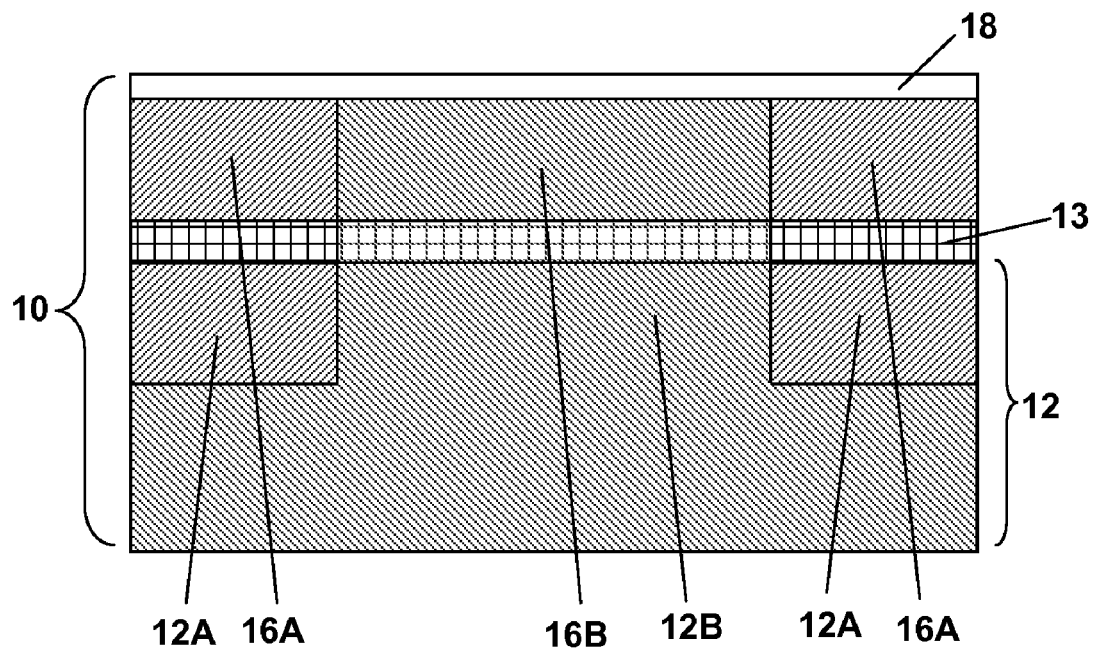

An optional surface protective layer 18 can be formed over both portions 16A and 16B of the semiconductor device layer, thereby forming an unpatterned layered substrate 10, which contains a semiconductor device layer with two different portions 16A and 16B of different crystallographic orientations, as shown in FIG. 29.

Figure 30:
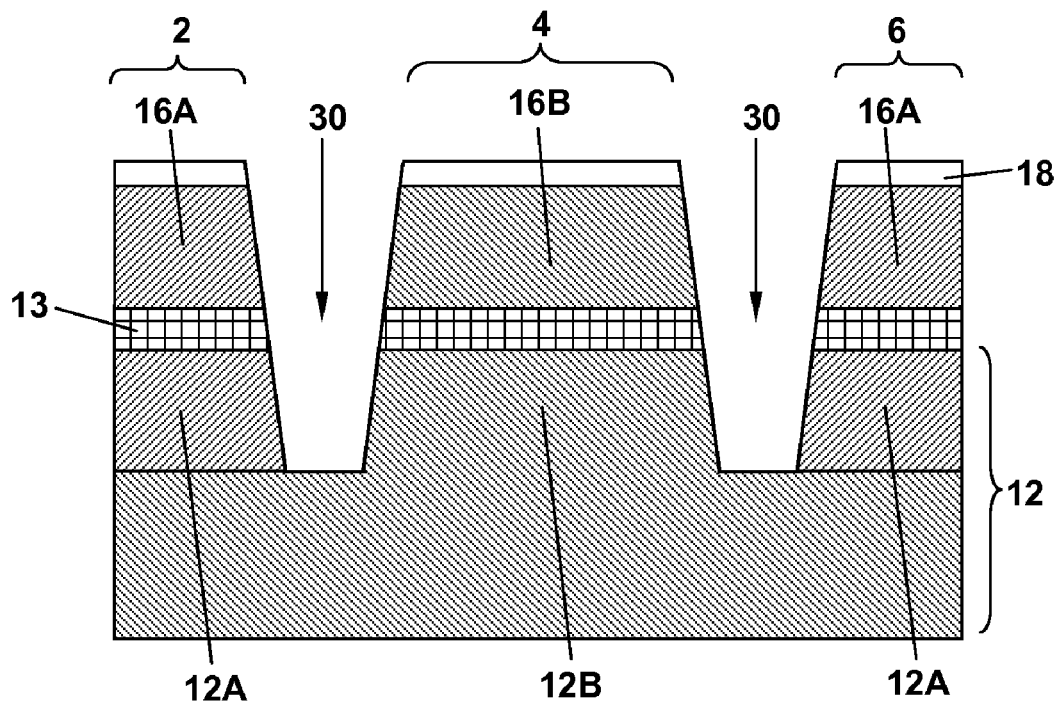

Such an unpatterned layered substrate 10 can then be patterned to form different device regions 2, 4, and 6 that are isolated from one another by isolation trenches 30 and contain semiconductor device layers 16A and 16B of different crystallographic orientations, as shown in FIG. 30.

Note that although the above-described processing steps form the n-doped sacrificial semiconductor layer 13 before the amorphization and recrystallization steps, it is understood that the n-doped sacrificial semiconductor layer 13 can also be formed after the amorphization and recrystallization steps. Further, the n-doped sacrificial semiconductor layer 13 can be formed by in-depth dopant implantation after epitaxial growth of the semiconductor device layer.

When the above description illustrates specific embodiments of the present invention, it should be recognized that the present invention is not so limited, but rather extends in utility to any other modification, variation, application, and embodiment, and accordingly all such other modifications, variations, applications, and embodiments are to be regarded as being within the spirit and scope of the invention.

What is claimed is:

1. A method for forming a semiconductor-on-insulator (SOI) substrate, comprising:

forming a substrate structure comprising at least a base semiconductor substrate layer and a semiconductor device layer with a sacrificial layer located therebetween, wherein the semiconductor device layer of the substrate structure has different portions of different crystallographic orientations, said forming the substrate structure includes:
  forming a base semiconductor substrate layer by bonding a first semiconductor layer of a first crystallographic orientation onto a second semiconductor layer of a second, different crystallographic orientation;
  implanting an n-type dopant species into an upper surface of the first semiconductor layer to form an n-doped sacrificial semiconductor layer;
  performing masked amorphization implantation to form one or more amorphous semiconductor regions that extends through the n-doped sacrificial semiconductor layer and the first semiconductor layer into the second semiconductor layer;
  recrystallizing said one or more amorphous semiconductor regions to form a recrystallized region having the second, different crystallographic orientation; and
  epitaxially growing a semiconductor device layer over the n-doped sacrificial semiconductor layer, wherein a first portion of the semiconductor device layer located outside the recrystallized region has the first crystallographic orientation, and wherein a second portion of the semiconductor device layer located directly over the recrystallized region has the second, different crystallographic orientation;

patterning the substrate structure to form one or more device regions with semiconductor device layers of different crystallographic orientations defined by one or more isolation trenches, wherein each device region comprises a base semiconductor substrate layer and a semiconductor device layer with a sacrificial layer located therebetween;

performing lateral etching to selectively remove a peripheral portion of the sacrificial layer in each device region, so that the vertical portions of the subsequently formed patterned insulator strips comprise ledges that extend between the base semiconductor substrate layer and the semiconductor device layer at each device region;

forming one or more insulator strips each having at least a vertical portion over a sidewall of one of the isolation trenches and a horizontal portion over an upper surface of one of the device regions;

filling the isolation trenches with a trench dielectric material and planarizing the substrate structure to remove the horizontal portions of the insulator strips and to form a substantially planar upper surface;

selectively removing the sacrificial layer from each device region to form an air gap between the base semiconductor substrate layer and the semiconductor device layer, wherein the vertical portions of the one or more insulator strips form vertical insulator pillars comprised of an oxide to support the semiconductor device layer; and filling the air gap within each device region with an insulator material to form a buried insulator layer between the base semiconductor substrate layer and the semiconductor device layer.

* * * * *